United States Patent
Dan

(10) Patent No.: US 11,839,981 B2
(45) Date of Patent: Dec. 12, 2023

(54) AUTONOMOUS MOVING TRANSFER ROBOT

(71) Applicant: AIrobot Co., Ltd., Tokyo (JP)

(72) Inventor: Tsuyoshi Dan, Tokyo (JP)

(73) Assignee: AIROBOT CO., LTD., Tokyo (JP)

( * ) Notice: Subject to any disclaimer, the term of this patent is extended or adjusted under 35 U.S.C. 154(b) by 475 days.

(21) Appl. No.: 17/046,173

(22) PCT Filed: Apr. 4, 2019

(86) PCT No.: PCT/CN2019/081597
§ 371 (c)(1),
(2) Date: Jul. 8, 2021

(87) PCT Pub. No.: WO2019/196755
PCT Pub. Date: Oct. 17, 2019

(65) Prior Publication Data
US 2021/0339393 A1 Nov. 4, 2021

(30) Foreign Application Priority Data
Apr. 8, 2018 (CN) .......................... 201810313546.0

(51) Int. Cl.
*B25J 9/16* (2006.01)
*B25J 5/00* (2006.01)
(Continued)

(52) U.S. Cl.
CPC ............ *B25J 9/1666* (2013.01); *B25J 5/007* (2013.01); *B25J 9/126* (2013.01); *B25J 9/1676* (2013.01);
(Continued)

(58) Field of Classification Search
CPC ........ B25J 9/1666; B25J 9/126; B25J 9/1676; B25J 9/1697; B25J 9/0087; B25J 9/009;
(Continued)

(56) References Cited

U.S. PATENT DOCUMENTS 6,459,955 B1 * 10/2002 Bartsch ................. A47L 9/0009
318/587
2013/0345875 A1 * 12/2013 Brooks .................. B25J 9/1671
700/258
(Continued)

FOREIGN PATENT DOCUMENTS

CN 2894965 Y 5/2007
CN 102923208 A 2/2013
(Continued)

OTHER PUBLICATIONS

International Search Report Issued in International Application No. PCT/CN2019/081597, dated May 29, 2019, 2 pages.

*Primary Examiner* — Khoi H Tran
*Assistant Examiner* — Nhi Q Bui
(74) *Attorney, Agent, or Firm* — Dilworth IP, LLC

(57) ABSTRACT

An autonomous moving transfer robot, including a main body with a base and a vertical plate; a traveling mechanism having a driving wheel and a driven wheel mounted on the base; a working mechanism having two manipulators, each with a mechanical arm, a proximal end of which is connected to the vertical plate, and a clamp pivotally connected to a distal end of the mechanical arm; the mechanical arms enable the clamps to reach a desired position, and the manipulators drive the clamps to grip and release a target object; a carrying mechanism having a plurality of plate-shaped carrying members for carrying the target object, the carrying members being fixed on the same side of the vertical plate, and arranged at intervals along the vertical direction; and a control system for controlling the walking/stopping and steering of the traveling mechanism and the movement of the manipulators.

19 Claims, 18 Drawing Sheets

(51) Int. Cl.
*B25J 9/12* (2006.01)
*B25J 11/00* (2006.01)
*B25J 13/08* (2006.01)
*B25J 18/02* (2006.01)
*B25J 18/04* (2006.01)

(52) U.S. Cl.
CPC ......... *B25J 9/1697* (2013.01); *B25J 11/0095* (2013.01); *B25J 13/089* (2013.01); *B25J 18/025* (2013.01); *B25J 18/04* (2013.01)

(58) Field of Classification Search
CPC ........ B25J 9/1602; B25J 9/1674; B25J 5/007; B25J 11/0095; B25J 11/00; B25J 13/089; B25J 18/025; B25J 18/04; B25J 15/00; B25J 19/023; B25J 9/1612; B25J 9/1682; B25J 9/0084; B25J 15/0052; B25J 15/0019; B25J 15/0033; B25J 11/005; G05B 2219/031005; G05B 2219/39091; G05B 2219/45063; G05B 2219/40298; G05B 2219/39466; G05B 2219/40307; G05B 2219/40267; G05B 19/4182; G05D 2201/0216; G05D 1/0246; G05D 1/0274; G05D 1/0282; Y02P 90/02; B65G 47/90; B65G 47/907; B65G 61/00; H01L 21/67724; H01L 21/67766; H01L 21/68707; A61B 34/76; A61B 1/00149; Y10S 901/01; Y10S 901/02; Y10S 901/31; Y10S 901/41; Y10S 901/30; Y10S 294/902; Y10S 483/901; Y10S 483/902

See application file for complete search history.

(56) References Cited

U.S. PATENT DOCUMENTS

| | | |
|---|---|---|
| 2016/0280461 A1 | 9/2016 | Geiger et al. |
| 2017/0173796 A1 | 6/2017 | Kim et al. |
| 2017/0368707 A1 | 12/2017 | Keller |
| 2018/0321671 A1* | 11/2018 | Pistorius ................ B25J 11/005 |
| 2019/0094017 A1* | 3/2019 | Wakabayashi ......... B25J 9/1697 |
| 2019/0184571 A1* | 6/2019 | Hou ........................ B25J 5/007 |

FOREIGN PATENT DOCUMENTS

| | | |
|---|---|---|
| CN | 203799263 U | 8/2014 |
| CN | 204076247 U | 1/2015 |
| CN | 105500381 A | 4/2016 |
| CN | 205220269 U | 5/2016 |
| CN | 106094815 A | 11/2016 |
| CN | 106584419 A | 4/2017 |
| CN | 106994693 A | 8/2017 |
| CN | 107053253 A | 8/2017 |
| CN | 107571238 A | 1/2018 |
| CN | 107717945 A | 2/2018 |
| CN | 206967478 U | 2/2018 |
| CN | 208629425 U | 3/2019 |
| CN | 208629426 U | 3/2019 |
| EP | 3224005 A1 | 10/2017 |
| JP | 1997267276 A | 10/1997 |
| JP | 1999005401 A | 1/1999 |
| JP | 2007216381 A | 8/2007 |
| JP | 2014511282 A | 5/2014 |
| JP | 2018020423 B2 | 2/2018 |
| JP | 2018507829 A | 3/2018 |
| KR | 20110127177 A | 4/2013 |

* cited by examiner

AUTONOMOUS MOVING TRANSFER ROBOT

CROSS-REFERENCE TO RELATED APPLICATION

The present application is a U.S. National Phase of International Patent Application Serial No. PCT/CN2019/081597 filed on Apr. 4, 2019. The entire contents of the above-cited application are hereby incorporated by reference in their entirety for all purposes.

TECHNICAL FIELD

The present disclosure relates to the technical field of automatic moving transfer robots, in particular to an autonomous moving transfer robot.

BACKGROUND ART

An automatic guided vehicle or self-guided vehicle features wheel-type movement, and does not require fixing devices, such as rails and support frames, to be provided in the region where it moves, thereby being not limited by sites, roads or space, and having the advantages of automation and flexibility. Therefore, the automatic guided vehicle is widely applied in automatic logistics systems to achieve efficient, economical and flexible unmanned production.

For example, in a semiconductor manufacturing system, automatic guided vehicles are often used to transfer front opening unified pods (foups) containing silicon wafers, for example, from a machine to a shelf, or from the shelf to the machine, or from one shelf to another.

However, the existing automatic guided vehicle generally can only carry one foup at a time and needs manual loading and unloading, thereby being inefficient.

SUMMARY OF THE INVENTION

An object of the present disclosure is to provide an autonomous moving transfer robot which is capable of performing automatic transfer of target objects without manual loading and unloading, thereby effectively improving the Takt time and working efficiency.

In order to achieve the above object, the present disclosure provides an autonomous moving transfer robot, comprising: a main body comprising a base and a vertical plate fixed to the base and extending upwards in a vertical direction; a running mechanism comprising driving wheels and driven wheels mounted on the base; an operation mechanism comprising two manipulators each comprising a mechanical arm having a proximal end connected to the vertical plate and a gripper pivotally connected to a distal end of the mechanical arm, the mechanical arm being configured to allow the gripper to reach a desired position, the two manipulators driving the two grippers to move towards or away from each other to grip or release a target object; a load bearing mechanism comprising a plurality of board-like bearers for bearing the target object, the plurality of bearers being all fixed to a same side, either a front side or a rear side, of the vertical plate and spaced apart in the vertical direction; and a control system for controlling walking/stopping and steering of the running mechanism and controlling movement of the manipulators.

According the above technical scheme, the autonomous moving transfer robot provided in the present disclosure is capable of transferring multiple target objects at a time. The specific working process is as follows: firstly, the control system controls the running mechanism to run so as to move the unloaded autonomous moving transfer robot to a first position in which the target object is stored; then, the control system controls the attitude of the gripper (the angle of rotation of the gripper about a pivot shaft thereof) and the movement of the mechanical arm to send the gripper to a desired position, so that the target object is gripped by the gripper through the movement of the mechanical arm; and thereafter, by controlling the movement of the mechanical arm, the gripped target object is placed onto one bearer of the load bearing mechanism, thereby completing the "loading" of one target object. Then, the above process could be repeated until all of the bearers have the target objects placed thereon. Then, the running mechanism is controlled to run so as to move the autonomous moving transfer robot and target object loaded thereof to a second position to which the target objects are to be transferred, and the target objects are in turn gripped by the manipulators from the corresponding bearers and moved to corresponding storage positions in the second position, thereby achieving the "unloading" of the target objects. In the process, the position of the autonomous moving transfer robot could be changed by controlling the running mechanism to run so as to facilitate the operation of the manipulators. According to the above description, the autonomous moving transfer robot provided in the present disclosure is capable of performing automatic transfer of target objects without manual loading and unloading, and is capable of carrying multiple target objects in a single pass, thereby effectively improving the Takt time and working efficiency. Additionally, multiple bearers are arranged in turn in the vertical direction, so that the space above the base is effectively utilized, thereby facilitating miniaturization of the autonomous moving transfer robot, broadening the application range and improving the agility.

Other features and advantages of the present disclosure will be described in detail in the detailed description below.

BRIEF DESCRIPTION OF THE DRAWINGS

The accompanying drawings, which are included to provide a further understanding of the disclosure and are incorporated in and constitute a part of this specification, illustrate the disclosure together with the detailed description below, and do not limit the disclosure. In the drawings.

REFERENCE NUMERALS

Figure 1:
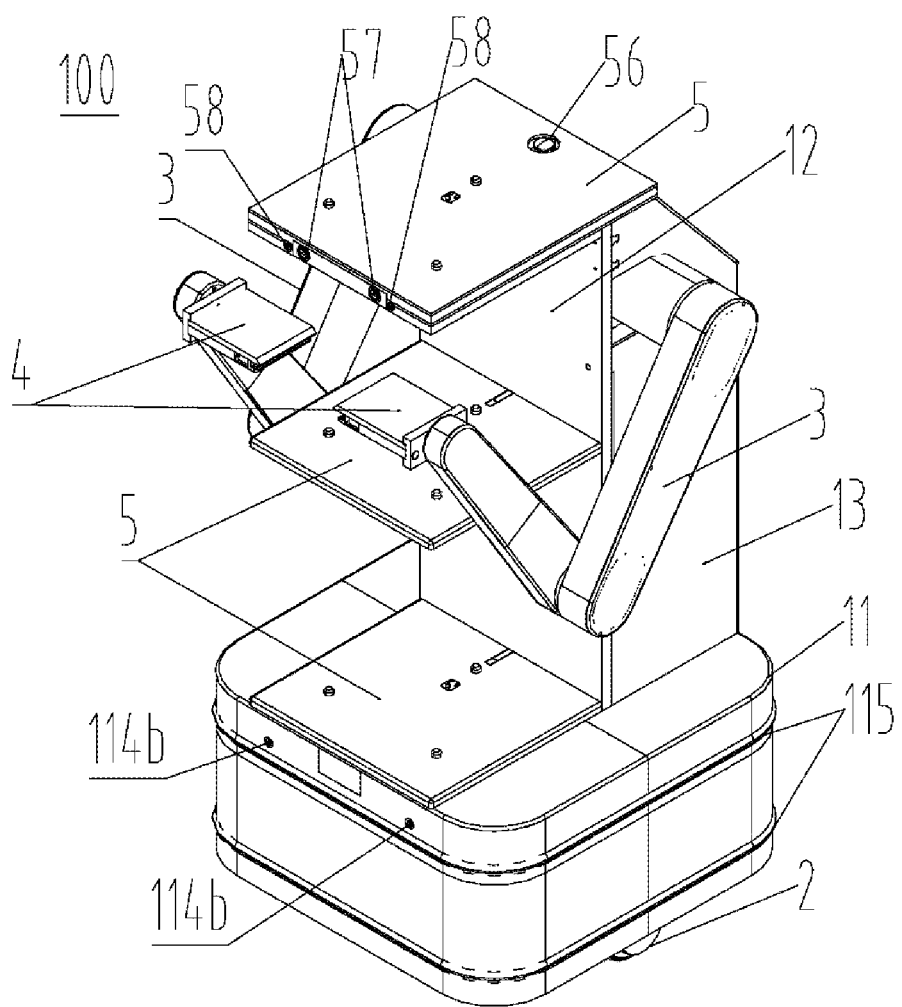
FIG. 1 shows a schematic perspective view of an autonomous moving transfer robot provided according to an embodiment of a first aspect of the present disclosure.
Figure 2:
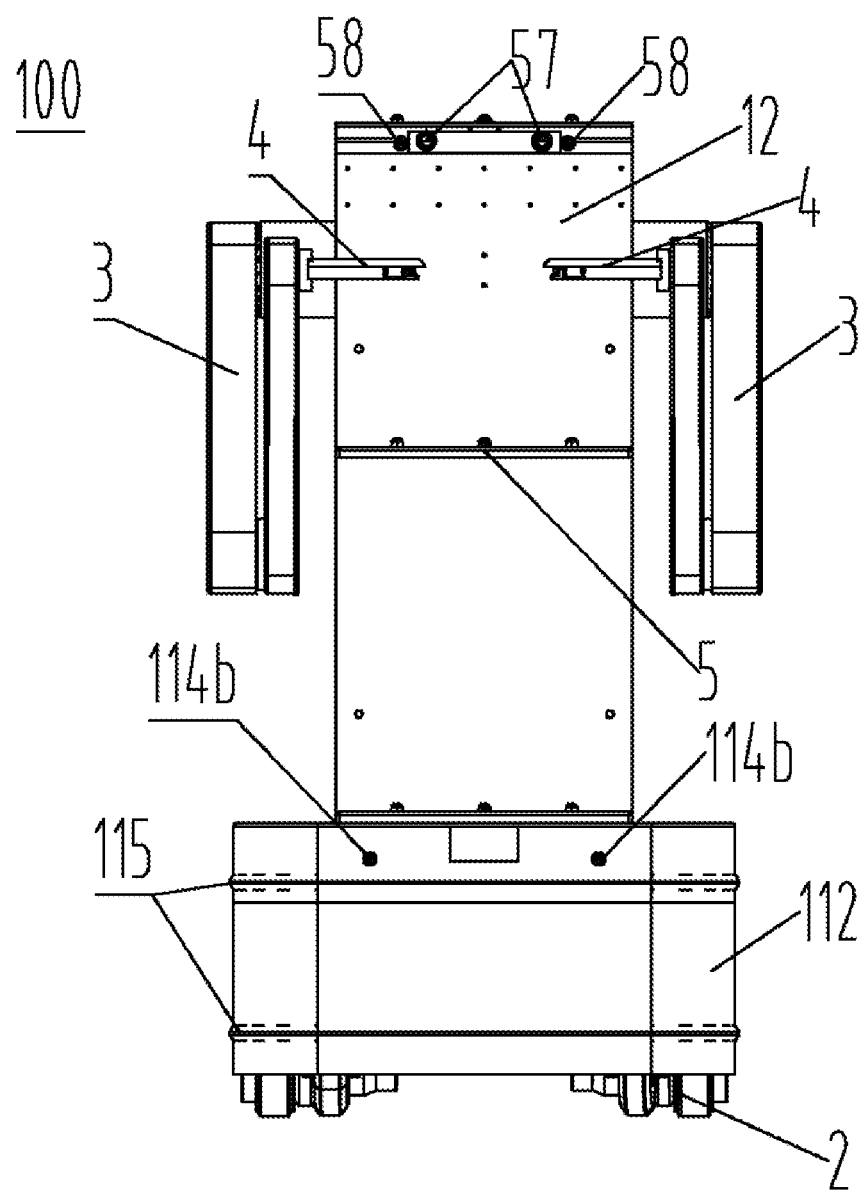
FIG. 2 shows a schematic front view of the autonomous moving transfer robot provided according to the embodiment of the first aspect of the present disclosure.

100—one-side load bearing two-arm type autonomous moving transfer robot, 200—both-side load bearing two-arm type autonomous moving transfer robot, 300—one-arm autonomous moving transfer robot, 400—target object, 500—machine, 11—base, 110—hinge receiver, 111—base plate, 112—apron, 113—distance detection device, 114a—first obstacle avoidance sensor, 114b—second obstacle avoidance sensor, 115—anti-collision strip, 116—bottom camera, 12—vertical plate, 13—casing, 14—operation screen, 2—running mechanism, 21—driving wheel, 211—mounting bracket, 212—driving motor, 213—driving wheel roller, 214—pivot shaft, 215—hoop, 22—spring plunger, 23—swivel caster, 3—mechanical arm, 31—telescopic arm, 32—rotary arm, 321—first arm section, 322—second arm section, 331—first driving device, 332—second driving device, 333—third driving device, 341—lead screw, 342—fixing seat, 351—first fixing plate, 352—second fixing plate, 361—sliding block, 362—guide rod, 4—gripper, 41—gripper main body, 411—support table, 412—boss, 413—trench groove, 421—first resilient clamping member, 4211—first proximal end, 4212—second proximal end, 4213—terminal, 422—second resilient clamping member, 4221—second proximal end, 4222—second distal end, 431—first cushion, 432—second cushion, 44—locating element, 45—proximity sensor, 46—closure plate, 47—first signal light source, 48—connecting block, 491—photographing camera, 492—flash lamp, 5—bearer, 51—board-like main body, 511—main board, 512—sandwiched board, 5121—opening, 513—cover board, 52—positioning structure, 53—RFID antenna, 54—target object detection device, 55—second signal light source, 56—emergency stop button; 57—binocular camera, 58—third obstacle avoidance sensor, 6—tongs, 61—tongs main body, 62—fixed clamping member, 621—fixed connection, 622—fixed clamp partion, 623—first intermediate connection, 63—movable clamping member, 631—movable connection, 632—movable clamp partion, 633—second intermediate connection, 641—slide rail, 642—slide groove, 65—driver, 66—joint block.

DETAILED DESCRIPTION OF THE INVENTION

Embodiments of the present disclosure will be described in detail below with reference to the drawings. It should be understood that the embodiments described herein are illustrative and explanatory only and are not restrictive of the present disclosure.

In the present disclosure, for facilitating the understanding, it is defined that the autonomous moving transfer robot has a length, a width, and a height corresponding to a longitudinal direction (X-direction), a transverse direction (Y-direction), and a vertical direction (Z-direction), respectively, wherein, unless otherwise specified, orientation words such as "upper, lower", "left, right", and "front, rear" generally refer to "upper, lower" in the vertical direction, "left, right" in the transverse direction, and "front, rear" in the longitudinal direction, respectively, "inner, outer" refers to "inner, outer" relative to the contour of a corresponding component, and "distal, proximal" refers to distal and proximal in distance relative to a component or structure. Additionally, the terms "first", "second", "third", "fourth", and the like, as used herein, are merely used to distinguish one element from another element and are not intended to be sequential or critical.

One-Side Bearing Two-Arm Type Autonomous Moving Transfer Robot

According to a first aspect of the present disclosure, there is provided a one-side load-bearing two-arm type autonomous moving transfer robot, an embodiment of which is shown in FIGS. 1 to 7. Referring to FIG. 1, a one-side load-bearing two-arm type autonomous moving transfer robot 100 comprises: a main body comprising a base 11 and a vertical plate 12 fixed to the base 11 and extending upwards in the vertical direction; a running mechanism 2 comprising driving wheels and driven wheels mounted on the base 11; an operation mechanism comprising two manipulators each comprising a mechanical arm 3 having a proximal end connected to the vertical plate 12, and a gripper 4 pivotally connected to a distal end of the mechanical arm 3, the mechanical arm 3 being configured to allow the gripper 4 to reach a desired position, the two manipulators being configured to move cooperatively to grip or release a target object 400 with the two grippers 4; a load bearing mechanism comprising a plurality of board-like bearers 5 for bearing the target object 400, the plurality of bearers 5 being all fixed to a same side (either a front side or a rear side, in the embodiment shown in FIGS. 1 to 7, the bearers 5 are all fixed to the front side of the vertical plate 12, while in other embodiments, the bearers 5 could be all fixed to the rear side of the vertical plate 12), and spaced apart in the vertical direction; and a control system for controlling walking/stopping and steering of the running mechanism and controlling movement of the manipulators.

According to the above technical scheme, the autonomous moving transfer robot provided according to the first aspect of the preset disclosure is capable of transferring multiple target objects 400 at a time. The specific working process is as follows: firstly, the control system controls the running mechanism 2 to run so as to move the unloaded autonomous moving transfer robot to a first position in which the target object 400 is stored; then, the control system controls the attitude of the gripper 4 (the angle of rotation of the gripper about a pivot shaft thereof) and the movement of the mechanical arm 3 to send the gripper 4 to a desired position, so that the target object 400 is gripped by the gripper 4 through the movement of the mechanical arm 3; and thereafter, by controlling the movement of the mechanical arm 3, the gripped target object 400 is placed onto one bearer 5 of the load bearing mechanism, thereby completing the "loading" of one target object 400. Then, the above process could be repeated until all of the bearers 5 have the target objects 400 placed thereon. Then, the running mechanism 2 is controlled to run so as to move the autonomous moving transfer robot and target object loaded thereof to a second position to which the target objects 400 are to be transferred, and the target objects 400 are in turn gripped by the manipulators from the corresponding bearers 5 and moved to corresponding storage positions in the second position, thereby achieving the "unloading" of the target objects 400. In the process, the position of the autonomous moving transfer robot could be changed by controlling the running mechanism 2 to run so as to facilitate the operation of the manipulators. According to the above description, the autonomous moving transfer robot provided in the present disclosure is capable of performing automatic transfer of the target objects 400 without manual loading and unloading, and is capable of carrying multiple target objects 400 in a single pass, thereby effectively improving the Takt time and working efficiency. Additionally, multiple bearers 5 are arranged in turn in the vertical direction, so that the space above the base 11 is effectively utilized, thereby facilitating miniaturization of the autonomous moving transfer robot, broadening the application range and improving the agility.

The autonomous moving transfer robot of the present disclosure is applicable to an unmanned production workshop, for example, a production workshop for silicon wafers, and the target object 400 is a foup box containing silicon wafers, so that by sending instructions to the autonomous moving transfer robot from a central control, the foup box can be transferred between a shelf, a machine 500 and a storage.

Figure 4:
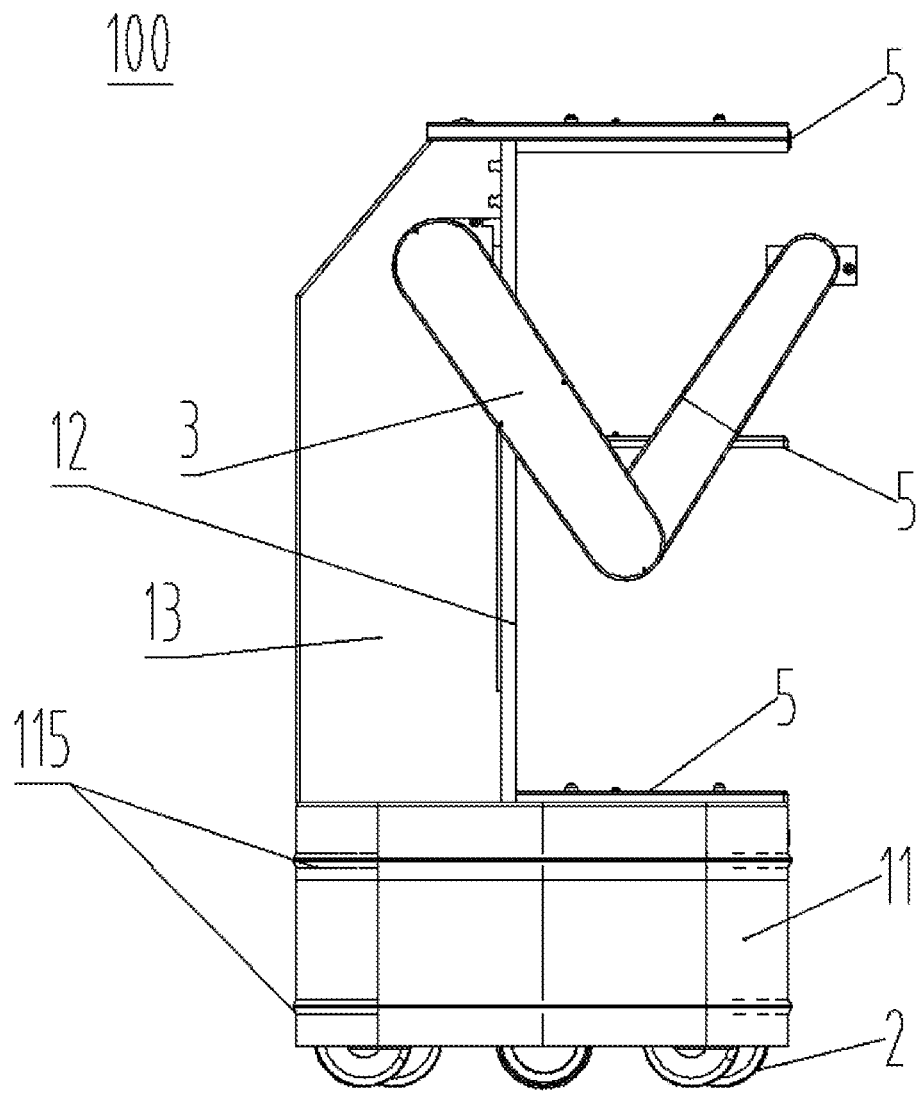
FIG. 4 shows a schematic side view of the autonomous moving transfer robot provided according to the embodiment of the first aspect of the present disclosure.
Figure 6:
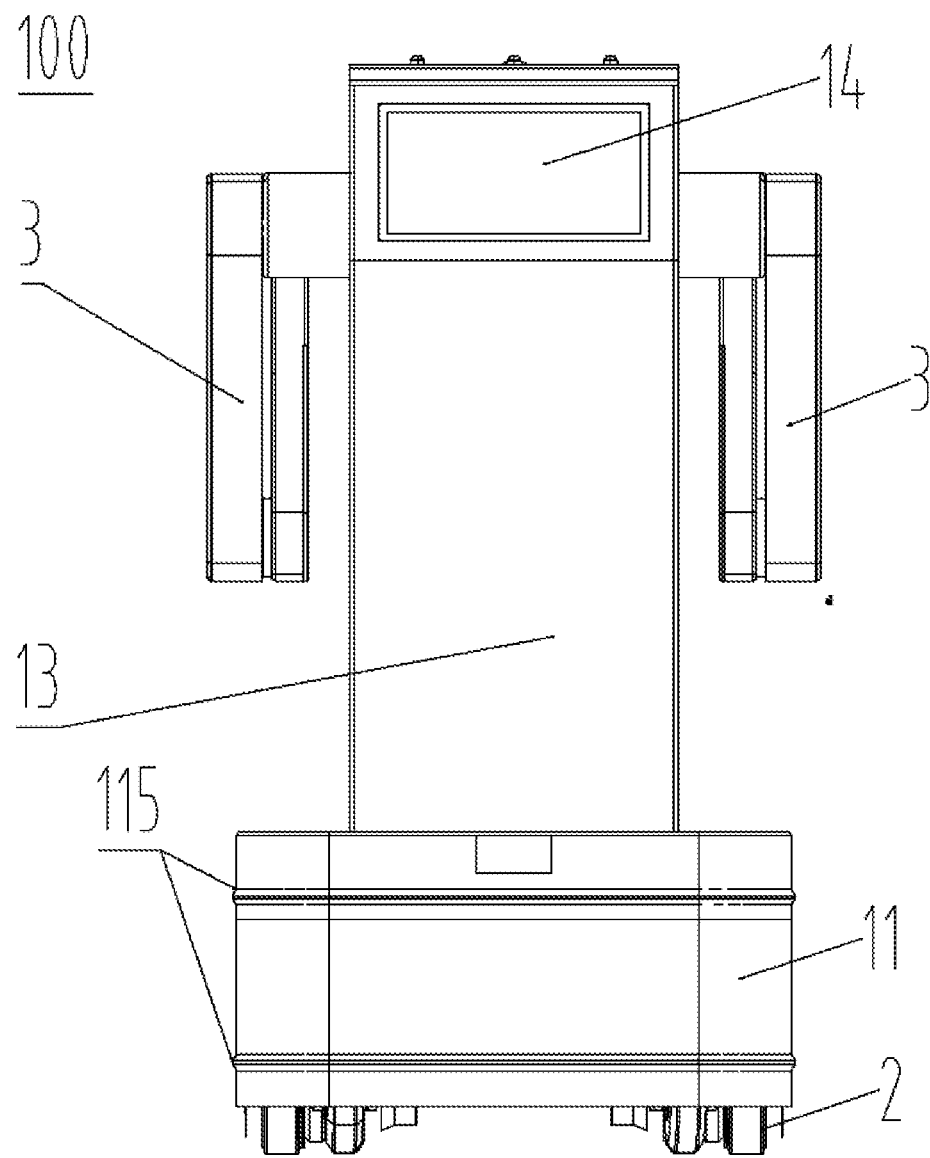
FIG. 6 shows a schematic rear view of the autonomous moving transfer robot provided according to the embodiment of the first aspect of the present disclosure.

Wherein, the base 11 could comprise a base plate 111 for mounting the running mechanism, and a lower end of the vertical plate 12 could be fixed to the base plate 111. Additionally, the autonomous moving transfer robot of the present disclosure needs to be provided with a built-in power supply for powering the electric components. Therefore, the autonomous moving transfer robot further comprises a power supply which is arranged on the base plate 111, and for aesthetic purposes, the base plate 11 is further provided with an apron 122 extending in the vertical direction to peripherally surround the base plate 111 so as to provide a space for placing the power supply, wires, etc. Additionally, the main body could further comprise a casing 13 enclosing a closed space with the vertical plate 12, a man-machine interaction console, for example, an operation screen 14 (as shown in FIG. 6), is arranged on the casing 13, the operation screen 14 tilts (as shown in FIGS. 4 and 6) to facilitate man-machine interaction operation, and the operation screen 14 is included in the control system.

Figure 3:
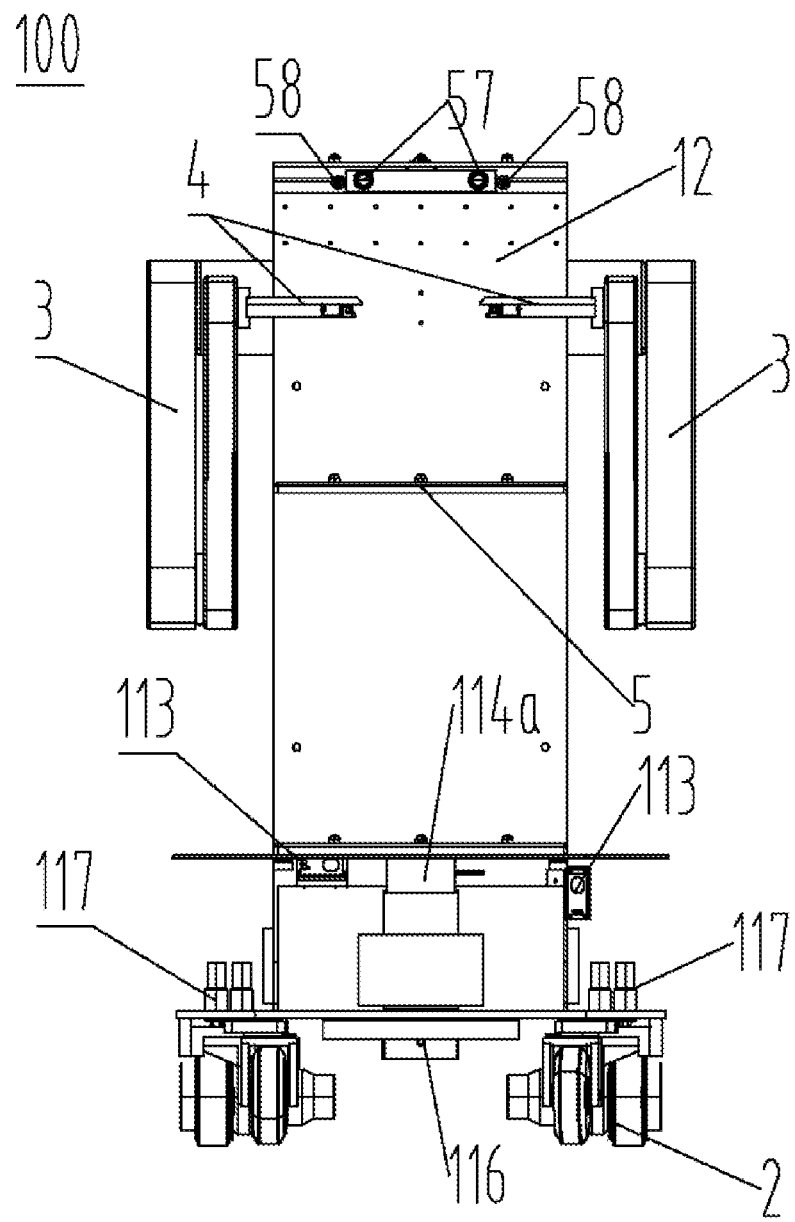
FIG. 3 shows a schematic front view of the autonomous moving transfer robot provided according to the embodiment of the first aspect of the present disclosure, with an apron removed to show structural components within a base.

In the embodiment provided in the first aspect of the present disclosure, the base 11 could be provided with two distance detection devices 113 which are arranged on the front side (and/or the rear side) of the autonomous moving transfer robot and spaced apart in the transverse direction of the autonomous moving transfer robot for detecting a distance between the autonomous moving transfer robot and a shelf storing the target object during "loading", as shown in FIG. 3. The distance detection device 113 is electrically connected with the control system to control the running mechanism 2 according to a distance signal from the distance detection device 113 so as to make the autonomous moving transfer robot to face to face with the shelf for storing the target object 400. The "align" herein could be understood as to make the autonomous moving transfer robot face to face with the shelf such that the whole target object 400 can be translationally moved onto the corresponding bearer 5, with a positioning slot of the target object 400 mating with a positioning structure of the bearer 5 described below. Wherein, the distance detection device 113 could be configured in any suitable manner, for example, could be configured to be a laser sensor. In order to ensure safety of the autonomous moving transfer robot in travel, a first obstacle avoidance sensor 114a for detecting surrounding obstacles is provided on both front and rear sides of the base 11 and is electrically connected with the control system, and the control system controls the running mechanism 2 to stop running and gives an alarm after receiving a danger signal sent by the first obstacle avoidance sensor 114a. The alarm could be either an audio alarm or a light alarm, for example, an alarm could be given as red light emitted from a first signal light source described below.

Optionally, a second obstacle avoidance sensor 114b is provided on left and/or right sides of the first obstacle avoidance sensor 114a to assist the first obstacle avoidance sensor 114a so as to increase the detection range and sensitivity. Additionally, a third obstacle avoidance sensor 58 is provided on the top bearer 5 above the first obstacle avoidance sensor 114a in the autonomous moving transfer robot and used for detecting surrounding obstacles to assist the first obstacle avoidance sensor 114a so as to increase the detection range and sensitivity. Upon detection of an obstacle, the obstacle avoidance sensor sends a danger signal, and the control system stops the walking operation of the running mechanism 2 immediately as soon as receiving the signal and gives an alarm.

Figure 5:
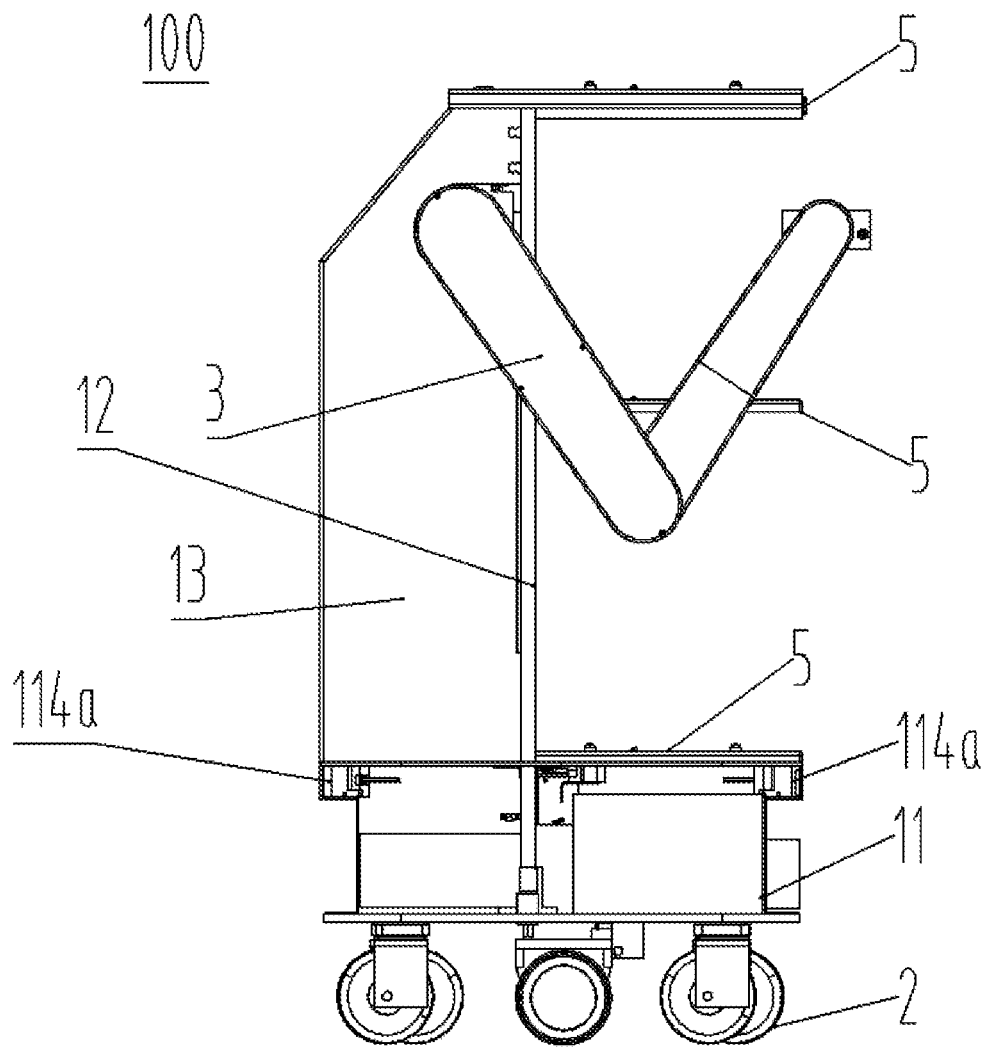
FIG. 5 shows a schematic side view of the autonomous moving transfer robot provided according to the embodiment of the first aspect of the present disclosure, with the apron removed to show structural components within the base.

As the autonomous moving transfer robot does not move in the left-right direction, it only needs to detect obstacles in the front and rear directions. Optionally, as shown in FIG. 5, the first obstacle avoidance sensor 114a comprises two infrared sensors disposed, respectively, on the front and rear sides of the autonomous moving transfer robot for performing diffuse detection in a fan-shaped region in front of the infrared sensors (in a spreading direction of infrared ray which spreads from back to front).

Additionally, the base 11 could be provided with two anti-collision strips 115 extending around outside the base 11 respectively, optionally, a collision sensor is arranged in the anti-collision strip 115 and is electrically connected with the control system, and the control system controls the running mechanism 2 to stop moving and gives an alarm after receiving a danger signal sent by the collision sensor so as to prevent the autonomous moving transfer robot from keeping traveling in the case of emergency collision.

Figure 7:
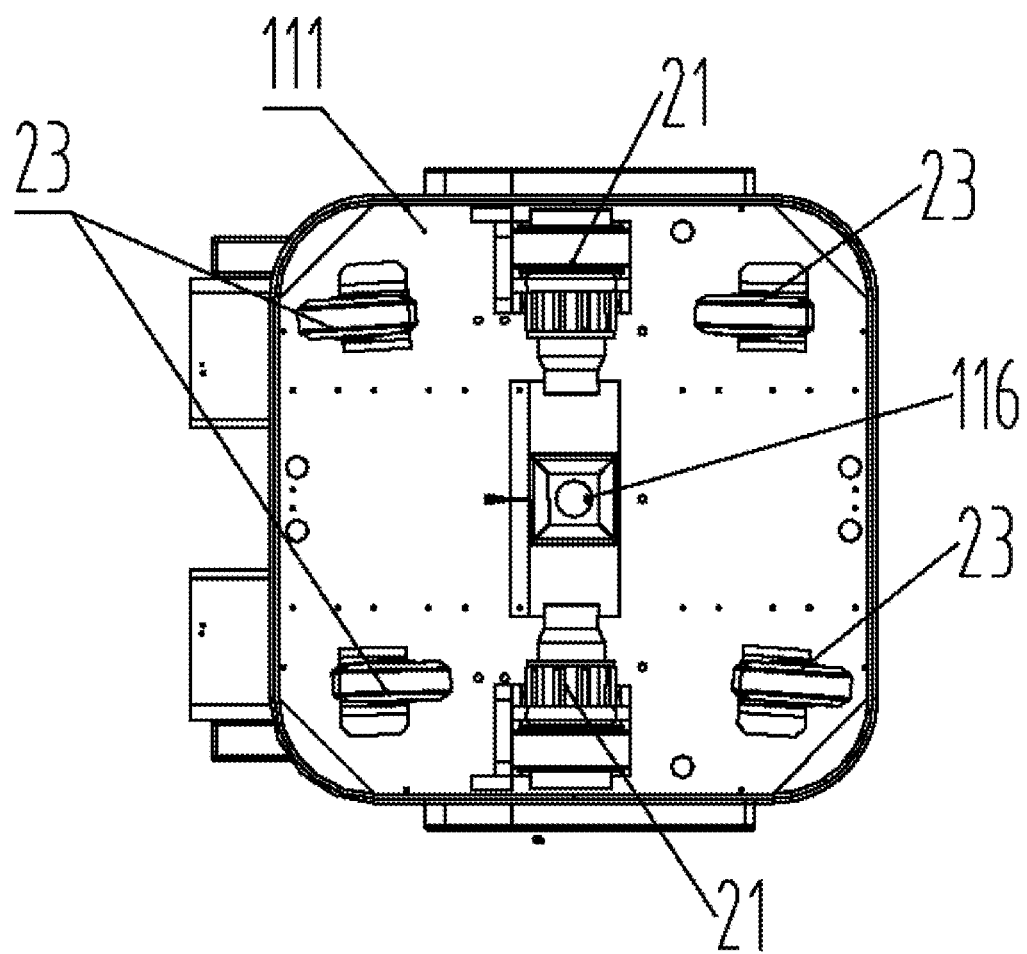
FIG. 7 shows a schematic top view of the autonomous moving transfer robot provided according to the embodiment of the first aspect of the present disclosure.
Figure 8:
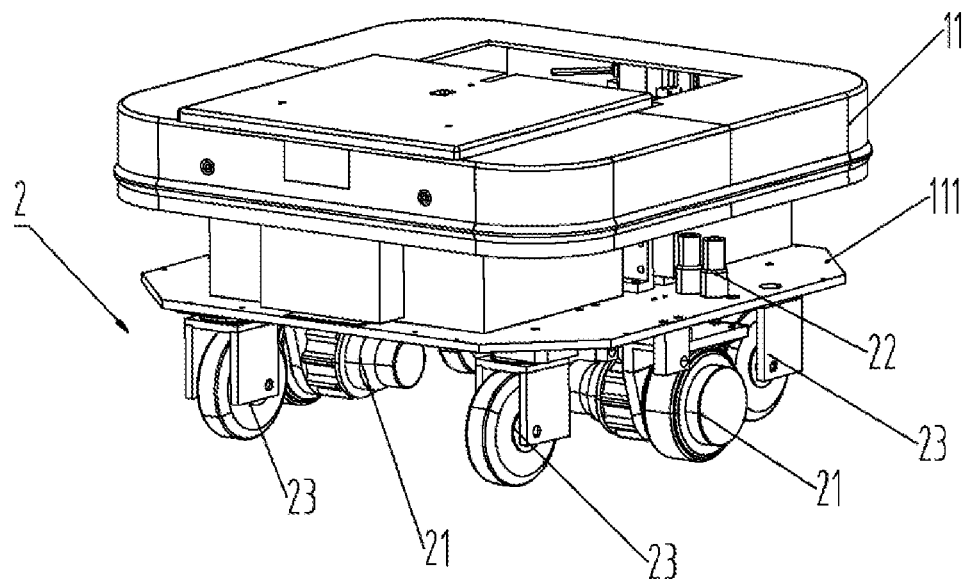
FIG. 8 shows a schematic perspective view of a running mechanism provided according to an embodiment of a second aspect of the present disclosure.
Figure 9:
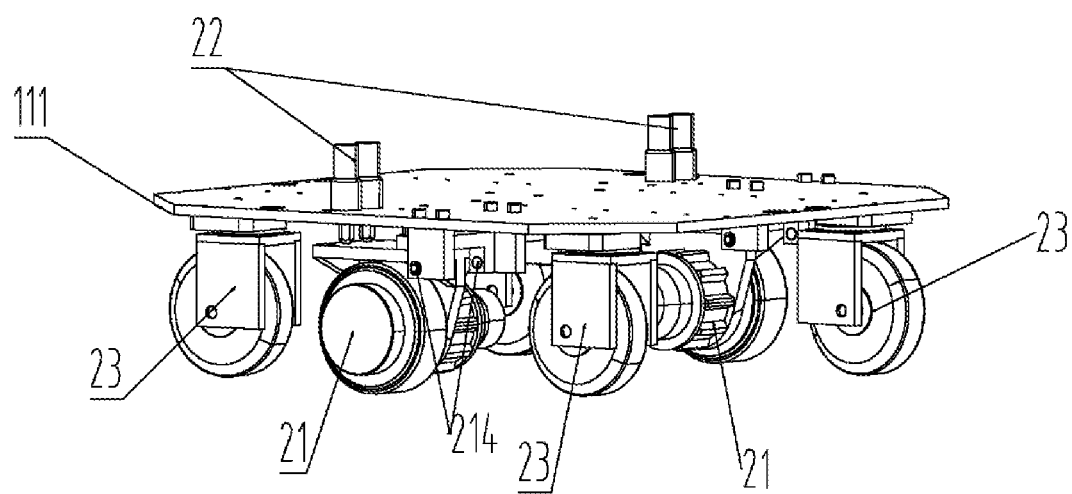
FIG. 9 shows another perspective view of the running mechanism provided according to the embodiment of the second aspect of the present disclosure.
Figure 10:
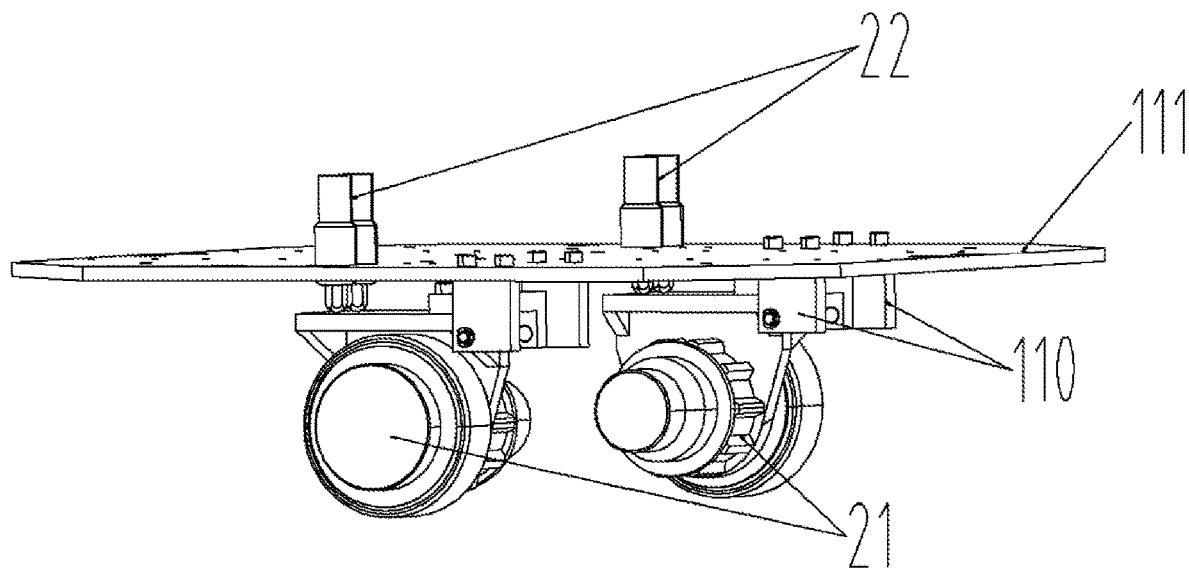
FIG. 10 shows another perspective view of the running mechanism provided according to the embodiment of the second aspect of the present disclosure, with driven wheels not shown.

Additionally, a bottom camera 116 (as shown in FIG. 7) is provided on a lower surface of the base 11 and electrically connected with the control system for capturing ground features in unscented navigation in cooperation with a binocular camera 57 (provided on a side surface of the top bearer 5, corresponding to a front or rear side in the traveling direction of the autonomous moving transfer robot for capturing surrounding environment features) described below, thereby positioning the autonomous moving transfer robot and correcting position deviation through trajectory compensation. Ground distance detection devices are provided at four corners of the base 11 respectively and are electrically connected with the control system for sending detected distance information to the control system, and the control system judges whether the ground in the front in the traveling direction is flat or not according to the distance information, and accordingly controls the running mechanism to run.

Wherein, the running mechanism could be configured in any suitable manner, optionally, the running mechanism is configured to be a running mechanism provided according to a second aspect of the present disclosure.

Wherein, the driven wheel could be configured in any suitable manner.

Wherein, the manipulator could be configured in any suitable manner, optionally, the mechanical arm of the manipulator could be configured to be a mechanical arm for an autonomous moving transfer robot provided according to a third aspect of the present disclosure, and the gripper of the manipulator could be configured to be a gripper for an autonomous moving transfer robot provided according to a fourth aspect of the present disclosure.

Wherein, the load bearing mechanism could be configured in any suitable manner, optionally, the bearer of the load bearing mechanism could be configured to be a bearer for an autonomous moving transfer robot provided according to a fifth aspect of the present disclosure.

The present disclosure will now be described in detail with reference to the accompanying drawings.

Running Mechanism

According to the second aspect of the present disclosure, there is provided a running mechanism, as shown in FIGS. 8-11, the running mechanism comprises two driving wheels 21 and at least two driven wheels, the driving wheel 21 has a central rotation axis (if the driving wheel 21 moves forwards when rotating in a first direction about the central rotation axis and moves backwards when rotating in a counter direction, and if the autonomous moving transfer robot provided according to the first aspect of the present disclosure comprises such running mechanism, the central rotation axis is parallel to the transverse direction of the autonomous moving transfer robot), and is hinged to the base 11, and a resilient member is arranged between the base 11 and the driving wheel 21, and has a first end pressing against the base 11 and a second end, opposite to the first end, pressing against the driving wheel 21 such that the driving wheel 21 is rotatable about a pivot axis parallel to the central rotation axis to move up and down relative to the base 11.

An existing four-wheel running mechanism, when walking on rough ground, could have problems that one driving wheel is suspended, or the four wheels, although all touching the ground, could be unevenly stressed, namely the pressure against the ground is uneven. In these cases, the wheels are subjected to different frictions against the ground, and the phenomenon of slipping could easily occur, affecting the trajectory of walking.

According to the above technical scheme, with the resilient member, the running mechanism of the present disclosure can drive the driving wheel 21 to rotate about the pivot axis thereof so as to move up and down relative to the base 11, so that the pressure of the driving wheel 21 against the ground is adjusted in real time, and the friction between the two driving wheels 21 and the ground is ensured to prevent the occurrence of slipping, or the two driving wheels 21 slip to a substantially same extent on the ground to ensure an actual displacement, thereby ensuring the trajectory of running.

Figure 11:
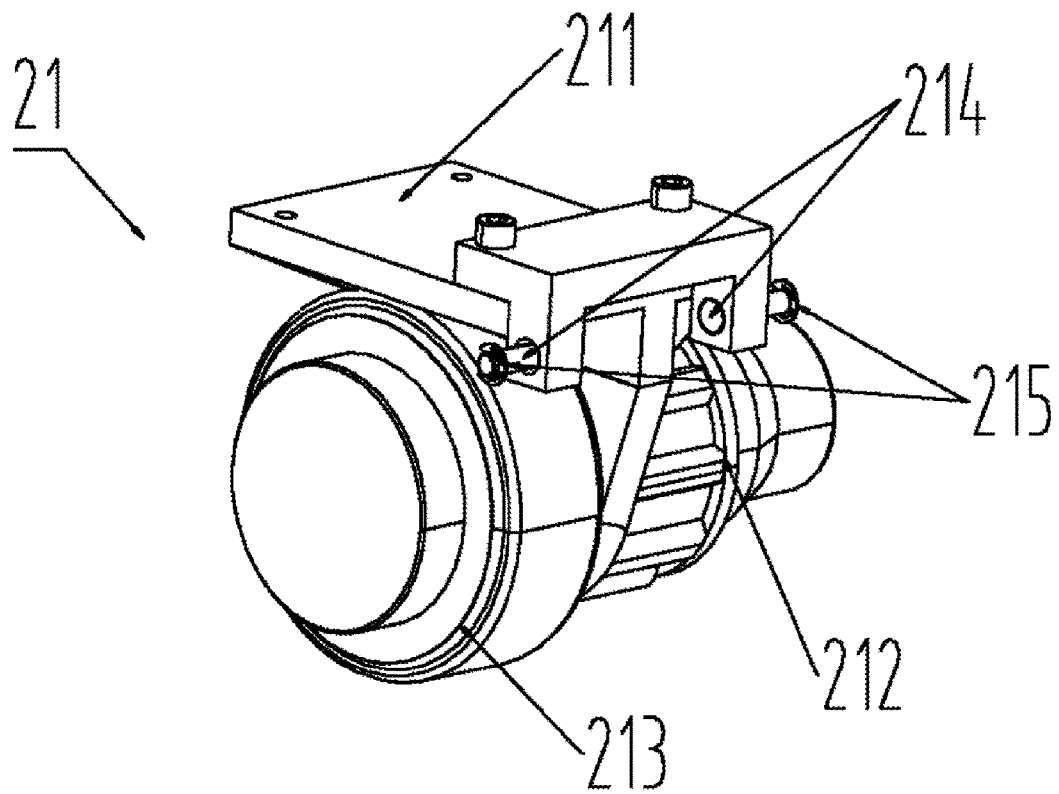
FIG. 11 shows a perspective schematic view of a driving wheel of the running mechanism provided according to the embodiment of the second aspect of the present disclosure.

In embodiments provided in the present disclosure, the driving wheel 21 could be configured in any suitable manner. Optionally, as shown in FIG. 11, the driving wheel 21 comprises a mounting bracket 211, a driving motor 212 fixed to the mounting bracket 211, and a driving wheel roller 213 fixed to an output shaft of the driving motor 212, the driving motor 212 drives the driving wheel roller 213 to rotate about an axis of an output shaft of the driving motor 212, and the mounting bracket 211 is connected, via a pivot shaft 214, to an hinge receiver 110 fixed to the base 11, wherein the pivot shaft 214 could be configured in any suitable manner, for example, the pivot shaft 214 could be configured to be a pin having one end terminally stopped by the mounting bracket 211 and the other end stopped by the hinge receiver 110 via a stopper, for example, stopped by the hinge receiver 110 via a hoop 215, as shown in FIG. 11. The second end of the resilient member presses against the mounting bracket (211). Optionally, the resilient member could be configured to be a spring plunger 22 fixed to the base 11 and having a head pressing against the mounting bracket 211 to serve as the second end. Additionally, in order to provide sufficient resilient eccentric pression, each driving wheel 21 could be correspondingly provided with two spring plungers 22. Optionally, the resilient member could be configured to be a disc spring or the like.

Optionally, the driven wheels could be configured to be mecanum wheels 23 such that the running mechanism is enabled to turn 360°. Optionally, the central rotation axes of the two driving wheels 21 are collinear, and a driven wheel group comprises two pairs of driven wheels, wherein in the direction of the central rotation axis, one pair of driven wheels is disposed on one side of the driving wheels 21, while the other pair of driven wheels is disposed on the other side of the driving wheels 21. With this arrangement, the running mechanism is enabled to turn 360° when walking either forward or backward. Optionally, the two pairs of driven wheels are symmetrically arranged about the central rotation axis, so that the center of gravity of the running mechanism is at the center of the line connecting the central rotation axes of the two driving wheels 21.

Wherein, in the running mechanism provided in the second aspect of the present disclosure, the mecanum wheels described above could be configured in any suitable manner.

On the basis of the above technical solution, in the second aspect of the present disclosure, there is also provided an autonomous moving transfer robot comprising the running mechanism 2 described above, and therefore also having the above-mentioned advantages.

Mechanical Arm

Figure 12:
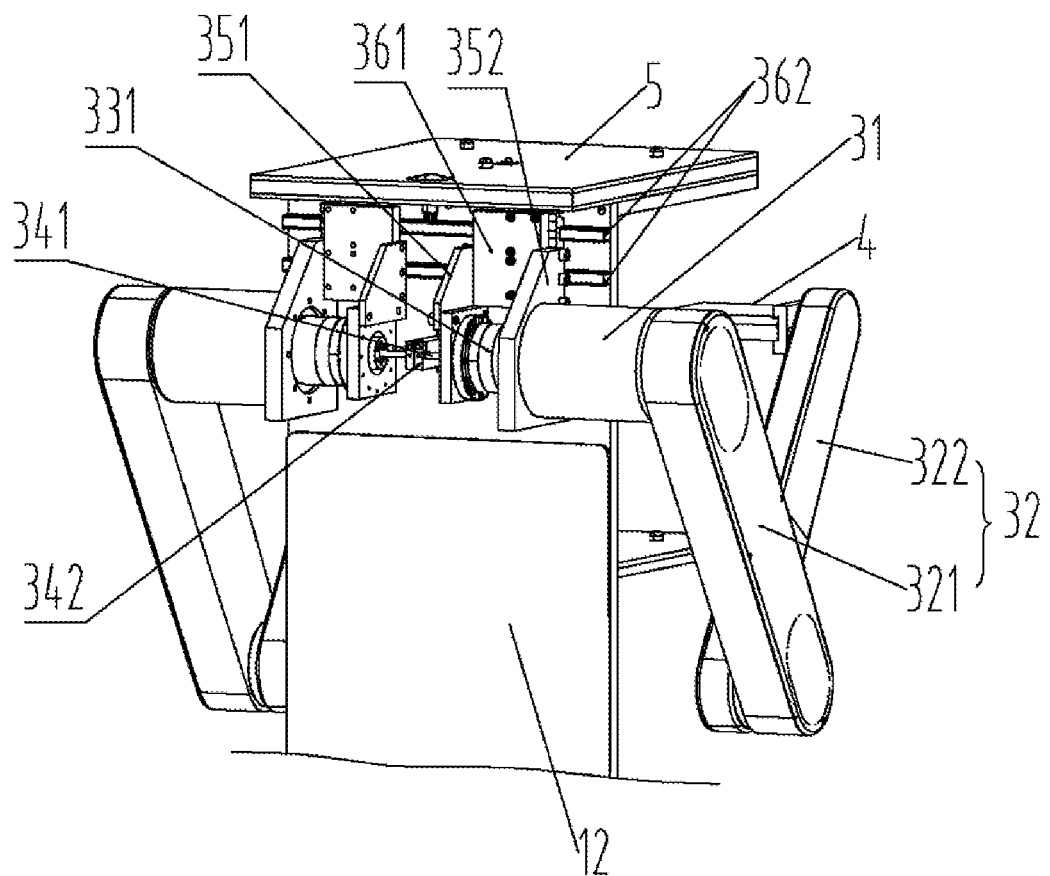
FIG. 12 shows a schematic perspective view of a mechanical arm provided according to an embodiment of a third aspect of the present disclosure.
Figure 13:
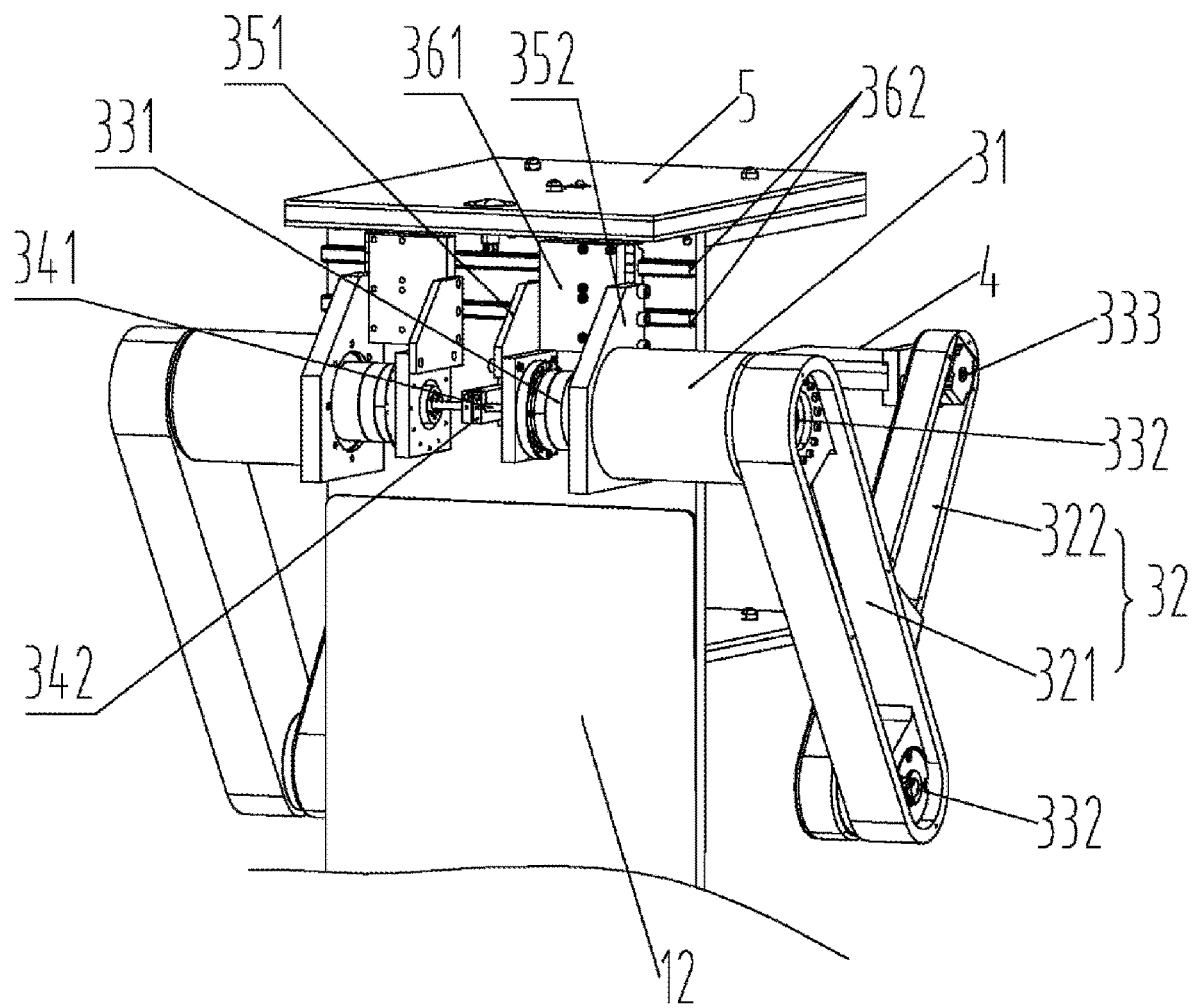
FIG. 13 shows another schematic perspective view of the mechanical arm provided according to the embodiment of the third aspect of the present disclosure, in which it can be seen that arm sections are hollow, and a second driving device and a third driving device are shown.
Figure 14:
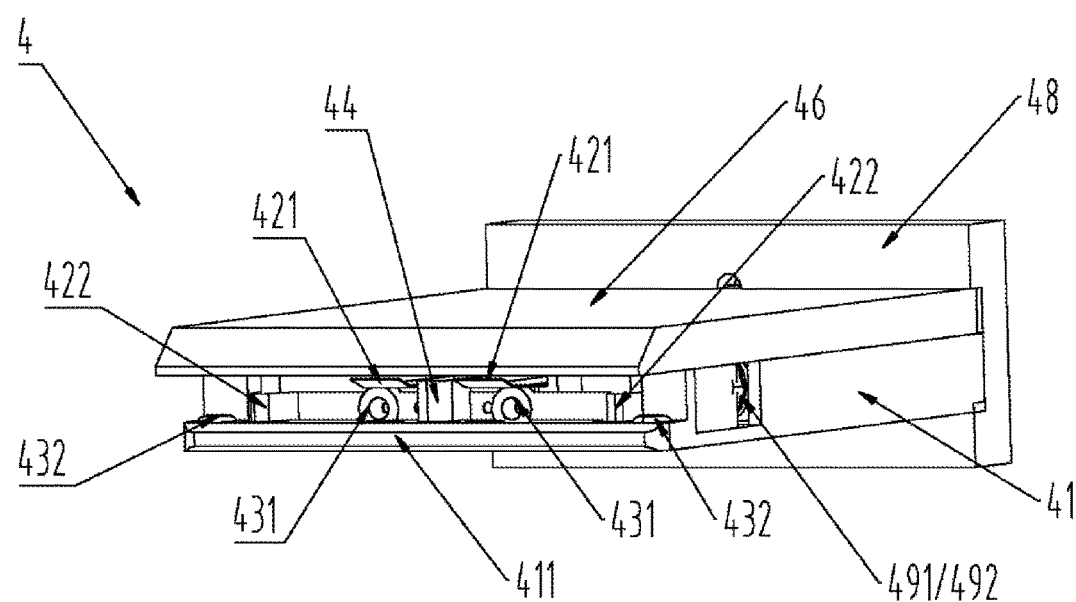
FIG. 14 shows a schematic perspective view of a gripper for an autonomous moving transfer robot provided according to an embodiment of a fourth aspect of the present disclosure.
Figure 15:
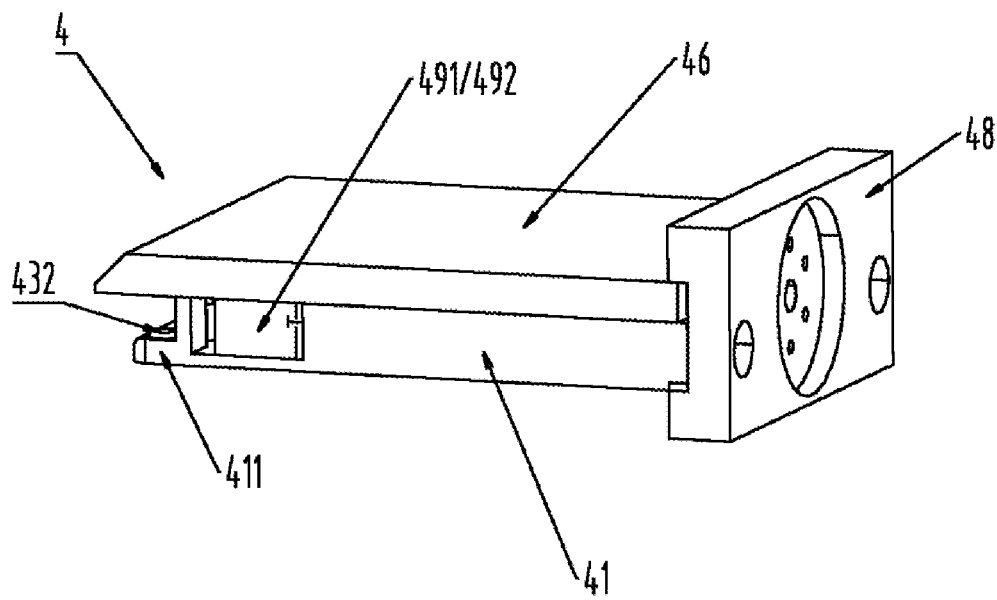
FIG. 15 shows a schematic perspective view, from another direction, of the gripper for the autonomous moving transfer robot provided according to the embodiment of the fourth aspect of the present disclosure.

According to a third aspect of the present disclosure, there is provided a mechanical arm, an embodiment of which is shown in FIGS. 12 and 13. Referring to FIGS. 12 and 13, the mechanical arm 3 comprises a telescopic arm 31, a rotary arm 32, and a driving device. The rotary arm 32 comprises a plurality of arm sections hinged in sequence, and has a proximal end hinged to a distal end of the telescopic arm 31, and a distal end pivotally connected to a gripping device (for example, the gripper 4 or tongs 6) to grip or release the target object 400. The driving device comprises: a first driving device 331 for driving the telescopic arm 31 to move in the transverse direction and a second driving device 332 for driving the arm sections to rotate about respective hinge shafts thereof, wherein the respective hinge shafts of the arm sections are parallel to each other and parallel to the transverse direction.

According to the above technical solution, the mechanical arm of the third aspect of the present disclosure has degrees of freedom in three perpendicular directions (i.e., X, Y, Z directions). The first driving device 331 drives the telescopic arm 31 to move in the transverse direction so as to adjust the positions of the telescopic arm 31 and the gripping device in the transverse direction (i.e., the Y direction), and the second driving device 332 drives the arm sections of the rotary arm 32 to rotate about respective hinge shafts thereof so as to adjust the position of the gripping device in a plane perpendicular to the transverse direction (i.e. the XZ plane). Therefore, with the mechanical arm of the present disclosure, the gripping device can be moved to a certain position in the space. Because X, Y, Z coordinates of the position of the target object 400 to be gripped in the three-dimensional space are definite with respect to the origin position of the gripping device, by driving the first driving device 331 and the second driving device 332, the gripping device can reach the gripping position to prepare for gripping the target object 400. Thereafter, by driving the telescopic arm 31 to move in the transverse direction or driving the arm sections to rotate about respective hinge shafts thereof, the gripping device can reach the gripping position to prepare for gripping the target object 400. Besides, by driving the telescopic arm 31 to move in the transverse direction or driving the arm sections to rotate about respective hinge shafts thereof, the target object 400 can be transferred to a target position, and then, by driving the telescopic arm 31 to move in the transverse direction or driving the arm sections to rotate about respective hinge shafts thereof, the gripping device could be leaded to release the target object 400, or after releasing the target object 400, the gripping device could be leaded to move away from the target object 400 to grip the next target object 400.

The mechanical arm 3 of the third aspect of the present disclosure will now be described in detail with reference to FIGS. 12 and 13.

In embodiments of the present disclosure, the first driving device 331 could be configured in any suitable manner, for example, could be configured to be a hydraulic cylinder or a pneumatic cylinder. Optionally, the first driving device 331 is configured to be a motor, and the telescopic arm 31 is connected with an output shaft of the motor through a transmission so as to allow rotational motion of the output shaft to be converted into linear motion of the telescopic arm 31 in the transverse direction.

Wherein, in order to optimize the utilization of limited space and achieve the purpose of miniaturization, a hollow shaft motor is used to serve as the motor. The transmission could be configured in any suitable manner, for example, could be configured to be a rack and pinion transmission. Optionally, the transmission is configured to be a lead screw transmission comprising a lead screw 341 and a nut cooperating with each other, and as shown in FIGS. 12 and 13, the lead screw 341 is fixed by a fixing seat 342. For example, when the mechanical arm 3 is applied in the autonomous moving transfer robot, the lead screw 341 is fixed to the main body (specifically, to the vertical plate 12) of the autonomous moving transfer robot by the fixing seat 342, the nut is fixed to the hollow output shaft of the hollow shaft motor (it is, of course, also possible to form an internal thread on the hollow output shaft), and the hollow shaft motor is fixedly connected to the telescopic arm 31. In this way, when the hollow output shaft rotates forwards for example, the telescopic arm is driven to move towards a first direction, and when the hollow output shaft rotates reversely for example, the telescopic arm is driven to move towards a second direction opposite to the first direction, thereby adjusting the position of the gripping device in the transverse direction.

Wherein, in order to prevent that the lead screw 341 bears all the weight of the hollow shaft motor, the telescopic arm 31, the rotary arm 32, the gripping device and even the target object 400, which leads to deformation such as bending or even fracture of the lead screw 341 and affects the normal operation, the hollow shaft motor could be fixed to a first fixing plate 351, the telescopic arm 31 could be fixed to a second fixing plate 352, and the first fixing plate 351 and the second fixing plate 352 are both fixed to a sliding block 361 which cooperates with guide rods 362 extending in the transverse direction and arranged on equipment where the mechanical arm 3 is provided, so that the telescopic arm 31, the rotary arm 32, the gripping device and even the target object 400 can move in the transverse direction along with the rotation of the hollow shaft motor. In this case, the weight of the hollow shaft motor as well as the weight of the telescopic arm 31, the rotary arm 32, the gripping device, and even the target object 400 are transferred to the equipment through the cooperation of the first fixing plate 351 and the second fixing plate 352 and the sliding block 361 with the guide rods 362 and are all born by the equipment. In a embodiment shown in FIGS. 17 and 18, the guide rods 362 are arranged on the vertical plate 12 of the autonomous moving transfer robot. Optionally, the telescopic arm 31 extends in the transverse direction and is hollow to facilitate wiring.

In embodiments of the present disclosure, the second driving device 332 could be configured in any suitable manner, for example, could be configured to be a hydraulic cylinder or a pneumatic cylinder. Optionally, the second driving device 332 could be configured to be a hollow shaft motor, the rotary arm 32 comprises a first arm section 321 and a second arm section 322 to obtain a bionic structure similar to a human arm, as shown in FIGS. 12, and 13, the first arm section 321 has a proximal end hinged to the telescopic arm 31 via a hollow shaft motor, and a distal end hinged to a proximal end of the second arm section 322 via the second driving device 332, and optionally, the arm sections are hollow to facilitate wiring.

Optionally, the driving device further comprises a third driving device 333 for driving the gripping device to rotate about a pivot shaft thereof, wherein the pivot shaft is arranged parallel to the transverse direction, so that the gripping device can rotate about the pivot shaft thereof to adjust its own attitude. In embodiments of the present disclosure, the third driving device 333 could be configured in any suitable manner, for example, could be configured to be a hydraulic cylinder or a pneumatic cylinder. Optionally, the third driving device 333 could be configured to be a hollow shaft motor provided at the distal end of the rotary arm 32 (in the embodiment shown in FIGS. 17 and 18, a hollow shaft motor serving as the third driving device 333 is provided at the distal end of the second arm section 322), and a hollow shaft of the hollow shaft motor is configured to be connected to the gripping device. It is to be understood that the gripping device is pivotally connected to the distal end of the rotary arm 32 via the hollow shaft motor.

On the basis of the above-mentioned technical solution, in the third aspect of the present disclosure, there is also provided an operation mechanism comprising the gripping device and the mechanical arm 3 described above, the gripping device being pivotally connected to the distal end of the mechanical arm 3. Additionally, in the third aspect of the present disclosure, there is also provided an autonomous moving transfer robot comprising the operation mechanism.

Gripper for an Autonomous Moving Transfer Robot

According to a fourth aspect of the present disclosure, there is provided a gripper 4 for an autonomous moving transfer robot, an embodiment of which is shown in FIGS. 14 to 17. The gripper 4 comprises a gripper main body 41 and a resilient clamping member, the gripper main body 41 is provided with a support table 411 for the target object 400 and a boss 412 above the support table 411, the resilient clamping member has a proximal end fixedly connected to the boss 412 and a distal end, opposite to the proximal end, for pressing against the target object 400 so as to cooperate with the supporting table 411 to releasably grip the target object 400.

According to the above technical solution, in the gripper 4 for the autonomous moving transfer robot provided in the fourth aspect of the present disclosure, the gripper main body 41 is provided with the support table 411 for the target object 400, and when the target object 400 is gripped, the target object 400 is supported by the support table 411, and the distal end of the resilient clamping member presses against the target object 400 so as to hold the target object 400 on the support table 411, so that the gripping of the target object 400 is achieved, and the target object 400 can be further driven to move. When the target object 400 is to be released, the gripper 4 could be directly moved away from the target object 400 to make the target object 400 leave the support table 411, and the resilient clamping member no longer presses against the target object 400, so that the release of the target object 400 is achieved.

In embodiments of the present disclosure, the resilient clamping member could be configured in any suitable manner. Optionally, the resilient clamping member comprises a first resilient clamping member 421 having a first proximal end 4211 fixed to the boss 412 and a first distal end 4212, opposite to the first proximal end 4211, extending over the support table 411 to form an resilient clamp, a clamping space for the target object 400 is defined between the resilient clamp and the support table 411, and the resilient clamp provides the target object 400 with a resilient clamping force towards the support table 411. Wherein, a terminal 4213 of the first distal end 4212 is bent in a direction away from the support table 411 for guiding the target object 400 into the clamping space.

Wherein, in order to prevent the target object 400 from being subjected to concentrated stress from the support table 411, optionally, the support table 411 could be provided with a first cushion 431 made of elastic material. Optionally, two first cushions 431 are provided and are spaced apart in the clamping space.

Figure 16:
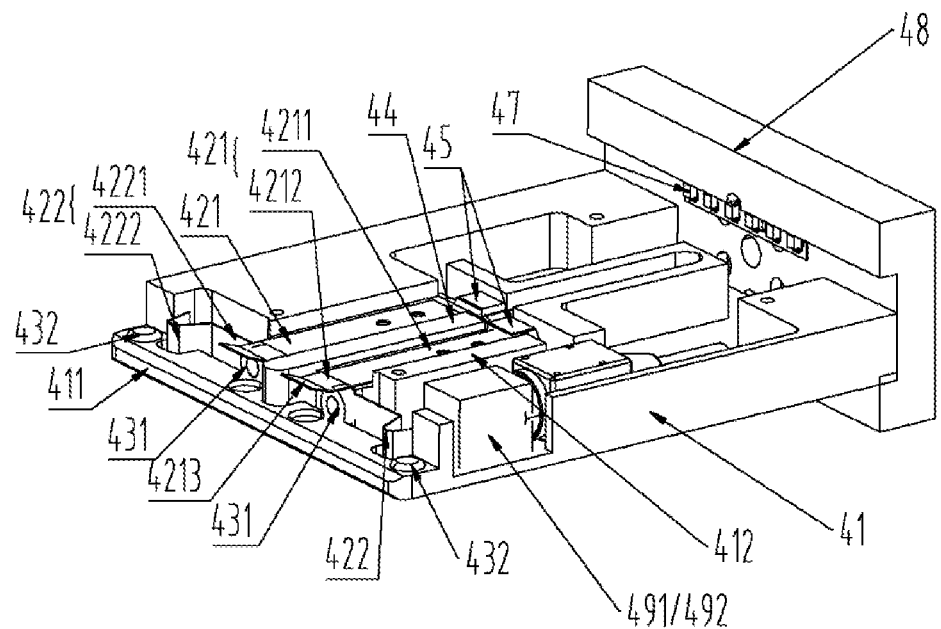
FIG. 16 shows another schematic perspective view of the gripper for the autonomous moving transfer robot provided according to the embodiment of the fourth aspect of the present disclosure, with a closure plate removed to show internal structure.
Figure 17:
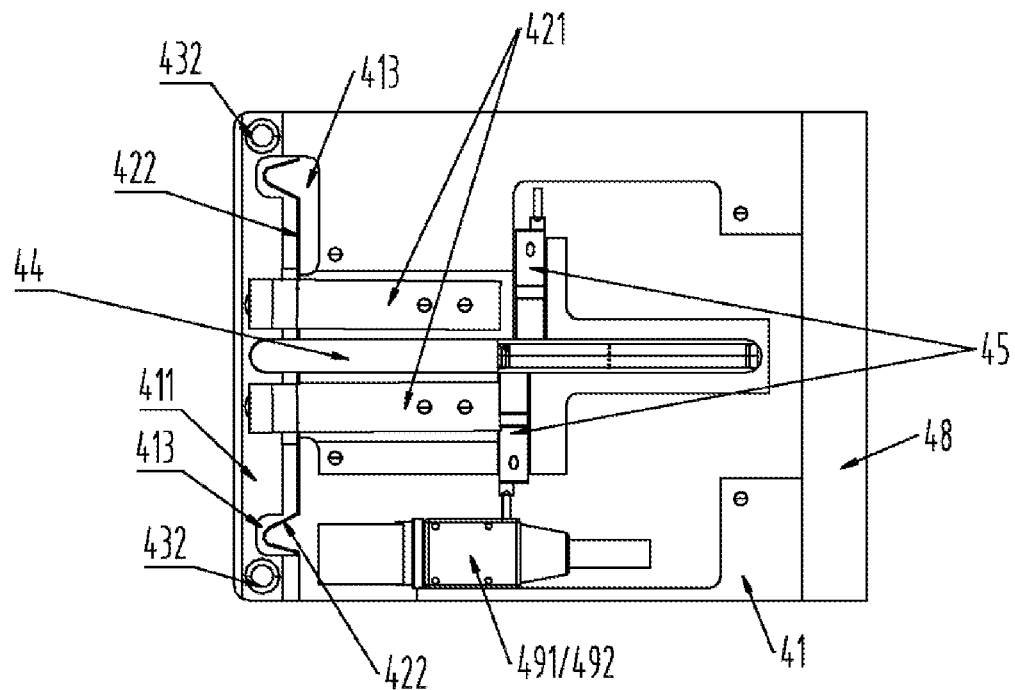
FIG. 17 shows a schematic top view of the internal structure of the gripper for the autonomous moving transfer robot provided according to the embodiment of the fourth aspect of the present disclosure.

In embodiments of the present disclosure, the resilient clamping member could further comprise a second resilient clamping member 422, as shown in FIGS. 16 and 17, the gripper main body 41 is provided with a trench groove 413 between the support table 411 and the boss 412, and the second resilient clamping member 422 is arranged in the trench groove 413, and has a second proximal end 4221 fixed to a side wall of the boss 412 and a second distal end 4222, opposite to the second proximal end 4221, for pressing against the target object 400 so as to provide the target object 400 with an outward resilient clamping force. In use, it needs to use two grippers 4 together to grip the target object 400 on opposite sides, and the two grippers 4 just clamp the target object 400 therebetween with the outward resilient clamping force provided by the second distal ends 4222 thereof. Wherein, an end portion of the second distal end 4222 is bent inward with the bend facing outward, thereby preventing concentrated stress applied to the target object 400. Optionally, in order to prevent that the target object 400 is subjected to concentrated stress applied by the boss 412 when the grippers 4 clamp the target object 400 therebetween, the side wall of the boss 412 could be connected with a second cushion 432 made of elastic material, and two second cushions 432 could be provided and spaced apart on the side wall of the boss 412.

In embodiments of the present disclosure, the gripper 4 could comprise a locating element 44 for aligning with a mark (for example, a notch) on the target object 400, the locating element 44 is retractably connected to the boss 412, an alignment sensor (for example, a photosensor) is provided on an end portion of the locating element 44, and when the end portion of the locating element 44 is aligned with the mark, the alignment sensor sends a validating signal, otherwise sends an alarm signal; and a proximity sensor 45 (for example, a photosensor) is provided on the boss 412, and when the locating element 44 is retracted and approaches the proximity sensor 45, the proximity sensor 45 sends a position confirmation signal.

Optionally, the gripper 4 could further comprise a closure plate 46 fixedly connected to the boss 412 above the boss 412, the gripper 4 is provided with a first signal light source 47 for indicating that the target object 400 is in the gripping position, the first signal light source 47 is arranged within the closure plate 46, and the closure plate 46 is made of translucent material. In this way, light emitted by the first signal light source 47 can be scattered into the environment by the closure plate 46 so as to be seen by a user from a distance.

Optionally, the gripper 4 further comprises a connecting block 48 to be pivotally connected with the mechanical arm 3 of the autonomous moving transfer robot, and the gripper main body 41 is fixedly connected to the connecting block 48. The first signal light source 47 could be fixed to the connecting block 48, the closure plate 46 is provided with a corresponding receiving hole, and when the gripper main body 41 is connected to the fixing block 48, the first signal light source 47 is just received in the receiving hole in the closure plate 46 fixed to the boss 412.

On the basis of the above technical solution, in the fourth aspect of the present disclosure, there is also provided an operation mechanism for an autonomous moving transfer robot, the operation mechanism comprises pairs of manipulators each comprising a mechanical arm and said gripper 4 for the autonomous moving transfer robot, the gripper 4 is connected to a distal end of the manipulator arm, and the two manipulators 4 in each pair of manipulators cooperate with each other to grip/release the target object 400.

In each pair of manipulators, the two grippers 4 are arranged opposite to each other, as shown in FIG. 1, the two grippers 4 approach each other to grip the target object 400 and move away from each other to release the target object 400.

Wherein, on the basis of the above technical solution, the manipulator of the operation mechanism for the autonomous moving transfer robot provided in the fourth aspect of the present disclosure could be configured in any suitable manner, for example, could be configured to be the mechanical arm 3 provided according to the third aspect of the present disclosure.

Optionally, a photographing camera 491 could be arranged on a front side of one of the two grippers 4 of the two manipulators, and a flash lamp 492 could be arranged on a front side of the other of the two grippers 4 of the two manipulators to supplement light for the photographing camera 491. Before the target object 400 is gripped, the target object 400 could be photographed from the front by the photographing camera 491 to capture visual feature points.

Additionally, in the fourth aspect of the present disclosure, there is also provided an autonomous moving transfer robot comprising the operation mechanism for the autonomous moving transfer robot provided in the fourth aspect of the present disclosure.

Bearer for an Autonomous Moving Transfer Robot

Figure 18:
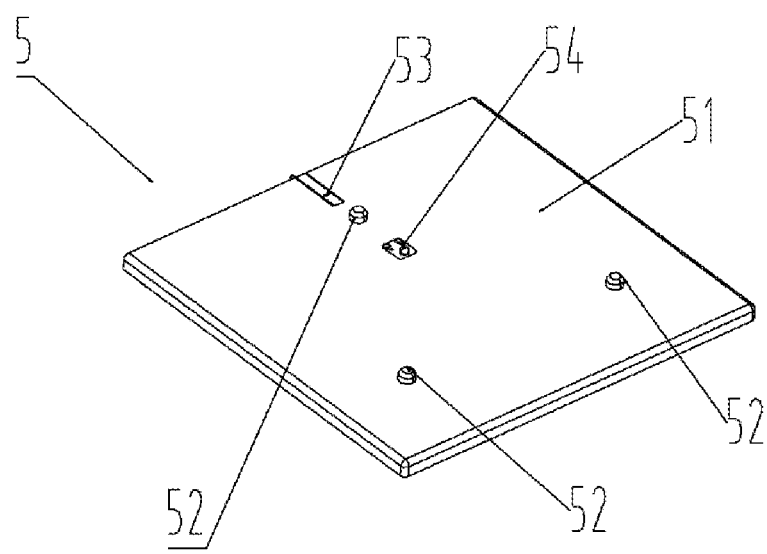
FIG. 18 shows a schematic perspective view of a bearer for an autonomous moving transfer robot provided according to an embodiment of a fifth aspect of the present disclosure.
Figure 19:
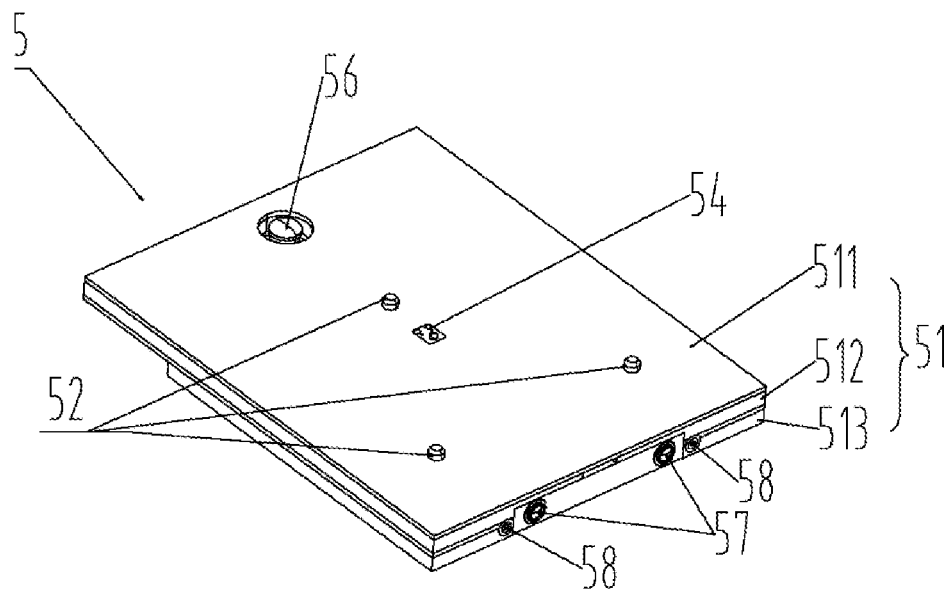
FIG. 19 shows a schematic perspective view of a bearer for an autonomous moving transfer robot provided according to another embodiment of the fifth aspect of the present disclosure.
Figure 20:
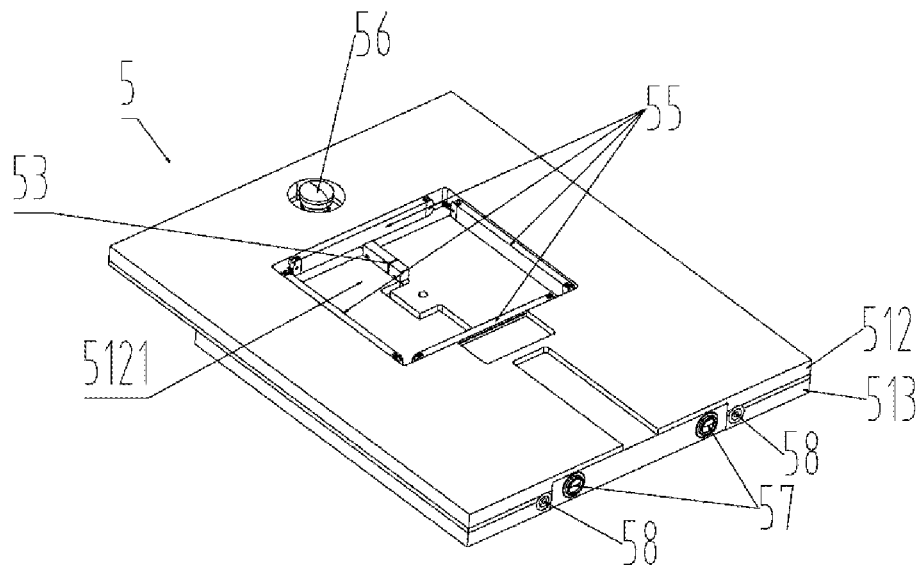
FIG. 20 shows a schematic perspective view of the bearer for the autonomous moving transfer robot provided according to another embodiment of the fifth aspect of the present disclosure, with a cover board removed to show internal structure.

According to a fifth aspect of the present disclosure, there is provided a bearer 5 for an autonomous moving transfer robot, an embodiment of which is shown in FIGS. 18 to 20. As shown in FIGS. 18 to 20, the bearer 5 comprises: a board-like main body 51 having a bearing surface for bearing the target object 400; a positioning structure 52 fixed to the bearing surface to mate with a positioning slot of the target object 400 to limit movement of the target object 400 on the board-like main body 51; an RFID antenna 53 fixed to the board-like main body 51 for reading a serial number of the target object 400; and a target object detection device 54 fixed to the board-like main body 51 for detecting whether a target object 400 is placed onto the bearer 5 or not.

According to the technical scheme, the bearer 5 provided in the fifth aspect of the present disclosure is capable of obtaining the serial number of the target object 400 while bearing the target object 400, so that a user can get the information of the target object 400 carried by the bearer 5. When the target object 400 is placed on the bearing surface, with the positioning structure 52, the target object 400 is prevented from sliding or even falling from the bearing surface under the action of an external force, and the position of any target object 400 on the bearing surface is unique, which facilitates automatic loading and unloading of the target object 400. Additionally, with the target object detection device 454, it is possible to determine whether there is a target object 400 on the bearer 5, so that on one hand, repeated loading of the target object 400 can be prevented, and on the other hand, whether the bearer 5 is loaded or not can be known.

In embodiments of the present disclosure, the positioning structure 52 could be configured in any suitable manner. Optionally, the positioning structure 52 is configured to be three positioning columns arranged to form a triangular shape, as shown in FIGS. 18 to 20. The target object detection device 54 comprises a detection partion protruding from the bearing surface, and when the positioning slot of the target object 400 mates with the positioning structure 52, the detection partion is capable of retracting into the board-like main body 51 under the action of gravity of the target object 400, and the target object detection device 54 sends an acknowledgement signal to indicate that the target object 400 is placed onto the bearing surface.

In embodiments of the present disclosure, the RFID antenna 53 could be configured in any suitable manner. Optionally, as shown in FIGS. 18 to 20, the RFID antenna 53 is disposed adjacent to the target object detection device 54 to facilitate wiring.

In embodiments of the present disclosure, the target object detection device 54 could be configured in any suitable manner. Optionally, the target object detecting device 54 is configured to be a photosensor, and the working principle thereof could be as follows: when the target object 400 is placed onto the bearer 5, the target object 400 covers the photosensor, and the photosensor sends an acknowledgement signal.

In embodiments of the present disclosure, the board-like main body 51 could be configured in any suitable manner. Optionally, as shown in FIGS. 19 and 20, the board-like main body 51 comprises a main board 511, a sandwiched board 512 and a cover board 513 which are sequentially connected in an overlapping manner, the sandwiched board 512 has an opening 5121 formed therein, a second signal light source 55 is arranged in the opening 5121, and the second signal light source 55 is capable of emitting light of multiple colors each indicating one working condition. For example, the second signal light source 55 could emit red light indicating an alarm, green light indicating normal operation, blue light indicating battery is low, etc. The cover board 513 and the sandwiched board 512 are both made of translucent or transparent material to scatter light emitted by the second signal light source 55 into the surrounding environment so as to be seen by a user from various angles and positions. Additionally, an emergency stop button 56 is provided on the cover board 513 to stop the operation of the autonomous moving transfer robot in emergency.

Wherein, in order to enable a user to see the light emitted by the second signal light source 55 from various angles and orientations, the second signal light source 55 could be configured to be bar-shaped, and four second signal light sources 55 are arranged in the opening 5121 and emit light towards the front, rear, left and right, respectively, so that the light emitted by the second signal light source 55 irradiates every orientation and corner.

In embodiments of the present disclosure, the cover board 513 and the sandwiched board 512 could both be made of organic glass to obtain the advantages of easy processing, high light transmittance, impact resistance, durability, etc.

In embodiments of the present disclosure, the bearer 5 is provided with a binocular camera 57, for example, to obtain a stereoscopic depth of field of 150°. The binocular camera 57 could be fixed to the board-like main body 51, for example, could be fixed to a side surface of the board-like main body 5.

Optionally, the bearer 5 is provided with a third obstacle avoidance sensor 58, the third obstacle avoidance sensor 58 is fixed to the front side of the board-like main body 51, two third obstacle avoidance sensors 58 are provided, and the binocular camera 57 is located between the two obstacle avoidance sensors 58.

On the basis of the above technical scheme, in the fifth aspect of the present disclosure, there is also provided an autonomous moving transfer robot comprising the gripper for the autonomous moving transfer robot provided in the fifth aspect of the present disclosure.

In summary, a one-side load bearing two-arm type autonomous moving transfer robot provided according to the first aspect of the present disclosure is obtained, and the one-side load bearing two-arm type autonomous moving transfer robot comprises a running mechanism provided according to the second aspect of the present disclosure, a mechanical arm 3 provided according to the third aspect of the present disclosure, a gripper 4 for the autonomous moving transfer robot provided according to the fourth aspect of the present disclosure, and a bearer 5 for the autonomous moving transfer robot provided according to the a fifth aspect of the present disclosure. Wherein, for the running mechanism, the driving motor 212 is electrically connected with the control system such that the rotation of the driving motor 212 is controlled by the control system. For the mechanical arm 3, the fixing seat 342 and the guide rods 362 could be arranged in the casing 13 and fixed to one side of the vertical plate 12, and the two mechanical arms 3 could share one lead screw 341, i.e., the fixing seat 342 is fixed at a middle position of the lead screw with the left part of the lead screw used for the mechanical arm on the left side and the right part of the lead screw used for the mechanical arm on the right side. The first driving device 331, the second driving device 332, and the third driving device 333 configured to be hollow shaft motors are all electrically connected to the control system, and the gripper 4 is fixed to the hollow shaft of the hollow shaft motor serving as the third driving device 333. The alignment sensor, the proximity sensor 45, the first signal light source 47, the photographing camera 491 and the flash lamp 492 of the gripper 4 are all electrically connected with the control system. The RFID antenna 53, the target object detection device 54, the second signal light source 55, the emergency stop button 56, the binocular camera 57 and the third obstacle avoidance sensor 58 of the bearer 5 are all electrically connected with the control system. In the autonomous moving transfer robot, two mechanical arms are provided and arranged symmetrically with respect to the longitudinal direction of the autonomous moving transfer robot. The autonomous moving transfer robot is provided with three bearers 5, a side of the vertical plate 12 on which the bearers 5 are provided is defined to be the front side, and the opposite side is defined to be the rear side. Wherein, the top bearer 5 is configured as in the embodiment shown in FIGS. 19 and 20, and the two bearers 5 below are configured as in the embodiment shown in FIG. 18, that is, only the top bearer 5 is provided with the second signal light source 55, the emergency stop button 56, the binocular camera 57 and the third obstacle avoidance sensor 58, and also only the board-like main body 51 of the top bearer 5 comprises the main board 511, the sandwiched board 512 and the cover board 513. The working process of such an autonomous moving transfer robot will be described in detail with reference to the drawings, in which an unmanned workshop of a semiconductor factory is taken as the working environment, and the operation is to transfer a foup box as a target object 400 between a shelf and a machine.

Firstly, after the unloaded autonomous moving transfer robot receives an instruction, the running mechanism is driven to walk to a position in front of the shelf, and then the autonomous moving transfer robot stands still and faces the shelf. The left and right distance detection devices 113 individually detect a distance between the autonomous moving transfer robot and the shelf, and the two distances are compared. And if the distances are equal, it indicates that the autonomous moving transfer robot is face to face with the shelf, otherwise, the control system controls one or two driving wheels 21 to rotate so as to adjust the autonomous moving transfer robot to align with the shelf. Then, the second driving device 332 operates to move the gripper 4 to the front of the foup box to be gripped on the shelf, and then the photographing camera 491 on the gripper 4 photographs the front and captures visual feature points. The control system judges whether the gripper 4 is in an aligned position at this moment, and if so, the second driving devices 332 of the two manipulators synchronously drive the rotary arms 32 to rotate about the hinge shafts thereof so as to move the two grippers 4 forward synchronously to gripping positions, i.e. gripping positions on both sides of the foup box, respectively. If the gripper 4 is not in the aligned position, the first driving device 331 is controlled to rotate to move the two telescopic arms 31 simultaneously towards left or right, so that the grippers 4 are sent to the aligned positions. Thereafter, the first driving devices 331 of the two manipulators are controlled to drive the two telescopic arms 31 to perform relative movement to make the two grippers 4 approach each other, so that the parts to be gripped of the foup box enter into the clamping spaces of the grippers 4 and are held on the support tables 411 by respective first resilient clamping members 421. When the gripper 4 contacts the foup box, if the end portion of the locating element 44 is aligned with the mark on the foup box, a validating signal is sent to the control system, the grippers 4 are controlled to continue the relative movement, the second resilient clamping members 422 of the two grippers 4 are resiliently deformed to provide opposite clamping forces from the two sides of the foup box, and the locating element 44 receives a pushing force from the foup box and retracts. When the locating element 44 approaches the proximity sensor 45, the proximity sensor 45 sends a position confirmation signal to the control system, the control system controls the mechanical arm 3 to stop moving so as to stop the gripper 4, and the first signal light source 47 of the gripper 4 sends green light to indicate that the gripping of the foup box is completed. If the end portion of the locating element 44 is not aligned with the mark on the foup box, an alarm signal is sent to the control system, the control system stops the movement of the mechanical arm 3 and controls the first signal light source 47 to send red light and/or a sound signal to inform the user to adjust the position of the foup box so that the gripper 4 can perform correct gripping.

After the foup box is gripped by the gripper 4, the control system controls the mechanical arm 3 to move to place the gripped foup box on one of the bearers 5, for example, the bottom bearer 5. When the foup box is placed onto the bearer 5, if the positioning slot of the foup box mates with the positioning structure 52, the target object detection devices 54 sends an right signal to the control system to indicate that the foup box has been placed on the bearer 5. By means of the RFID antenna 53 of the bearer 5, an FID code of the foup box can be read, so that information of the foup box placed on the bearer 5 could be obtained.

Thus, the loading of one foup box is completed.

Similarly, after the loading of the previous foup box is finished, the control system controls the running mechanism to run so as to move the autonomous moving transfer robot to a position for loading a next foup box on the shelf to perform loading of this foup box.

After fully loaded, the autonomous moving transfer robot is controlled by the control system control to run to the machine for unloading. In the running process, the bottom camera 116 photograph the ground to obtain features of the ground so as to determine a current position of the autonomous moving transfer robot, and trajectory compensation is carried out when position deviation occurs. When the features of the ground cannot be identified, the binocular camera 57 could photograph the environment so as to determine the current position of the autonomous moving transfer robot using a slam algorithm. In the running process, the running mechanism provided in the second aspect of the present disclosure is used, so that the pressure of the two driving wheels 21 against the ground is ensured, and the traveling direction of the autonomous moving transfer robot is ensured. The ground distance detection device senses the condition of the ground in the front, and if a pit or an obstacle is found, the control system controls the autonomous moving transfer robot to stop traveling and gives an alarm. At the same time, if the first obstacle avoidance sensor 114a and/or the second obstacle avoidance sensor 114b and/or the third obstacle avoidance sensor 58 and/or the collision sensor detect(s) an obstacle in the traveling direction of the autonomous moving transfer robot, the control system controls the autonomous moving transfer robot to stop traveling and gives an alarm. Additionally, if the foup box on the bearer 5 is taken away by a person, the control system controls the autonomous moving transfer robot to immediately stop traveling and gives an alarm after receiving a signal sent from the target object detection device 54.

Two-Side Load Bearing Two-Arm Type Autonomous Moving Transfer Robot

Figure 21:
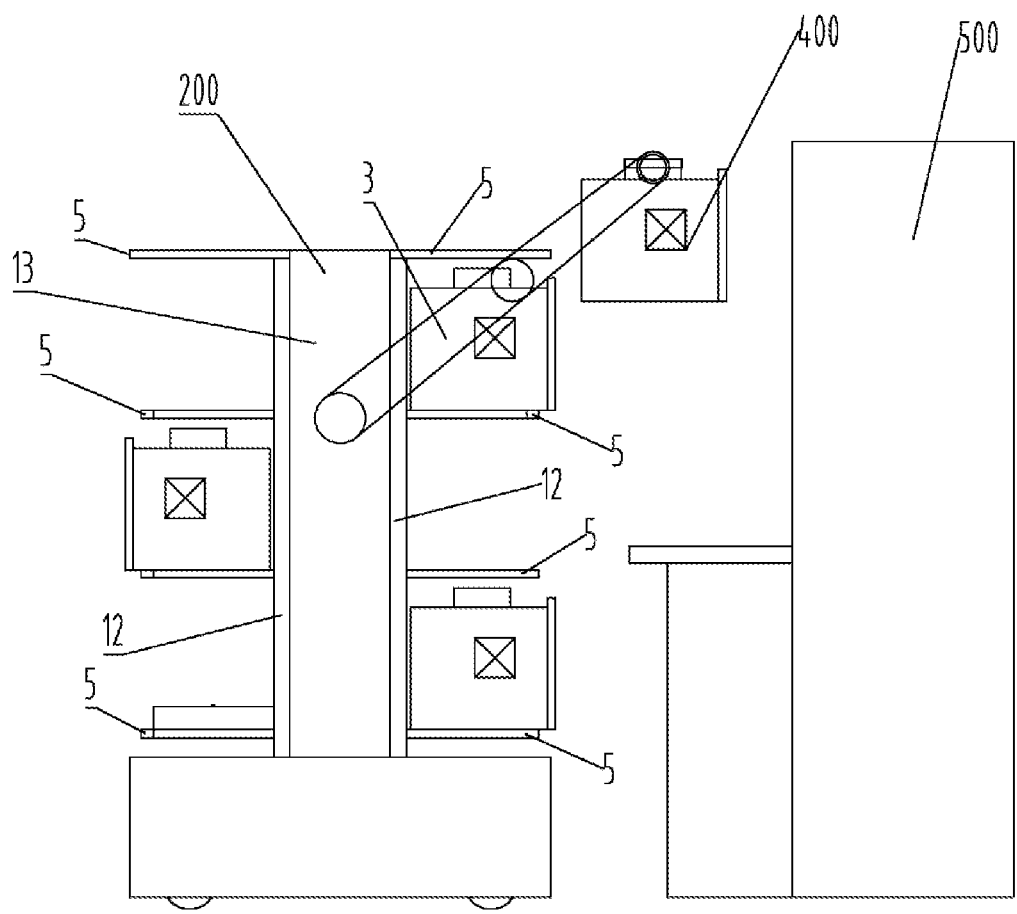
FIG. 21 shows a schematic side view of an autonomous moving transfer robot provided according to an embodiment of a sixth aspect of the present disclosure.

According to a sixth aspect of the present disclosure, there is provided a two-side load bearing two-arm type autonomous moving transfer robot 200, which differs from the autonomous moving transfer robot provided in the first aspect of the present disclosure in that: the two-side load bearing type autonomous moving transfer robot provided according to the sixth aspect of the present disclosure is provided with two vertical plates 12, a casing 13 is arranged between the two vertical plates 12 and forms a closed space with side surfaces, facing each other, of the two vertical plates 12; and a first driving device 331, a lead screw 341, a fixing seat 342, etc. of a mechanical arm 3 are disposed in the closed space. Two side surfaces, facing the outside, of the two vertical plates 12 both have the bearers 5 fixed thereto, and the bearers 5 on the same side surface are uniformly spaced apart in the vertical direction, as shown in FIG. 21. In consideration of spatial arrangement, the two-side load bearing type autonomous moving transfer robot provided in the sixth aspect of the present disclosure does not comprise an operation screen, i.e., a man-machine interaction interface.

The autonomous moving transfer robot provided according to the sixth aspect of the preset disclosure is capable of transferring multiple target objects 400 at a time. The specific working process is as follows: firstly, the control system controls the running mechanism 2 to run so as to move the unloaded autonomous moving transfer robot to a first position in which the target object 400 is stored; then, the control system controls the attitude of the gripper 4 (the angle of rotation of the gripper about a pivot axis thereof) and the movement of the mechanical arm 3 to send the gripper 4 to a desired position, so that the target object 400 is gripped by the gripper 4 through the movement of the mechanical arm 3; and thereafter, by controlling the movement of the mechanical arm 3, the gripped target object 400 is put onto one bearer 5 of the load bearing mechanism, thereby completing the "loading" of one target object 400. Then, the above process could be repeated until all of the bearers 5 have the target objects 400 put thereon. Then, the running mechanism 2 is controlled to run so as to move the autonomous moving transfer robot and foup boxes loaded thereof to a second position to which the target objects 400 are to be transferred, and the target objects 400 are in turn gripped by the manipulators from the corresponding bearers 5 and put on storage positions corresponding to the second position, thereby completing the "unloading" of the target objects 400. In the process, the position of the autonomous moving transfer robot could be changed by controlling the running mechanism 2 so as to facilitate the operation of the manipulators. According to the above description, the autonomous moving transfer robot provided in the present disclosure is capable of performing automatic transfer of the target objects 400 without manual loading and unloading, and is capable of carrying multiple target objects 400 in a single pass, thereby effectively improving the Takt time and working efficiency. Additionally, multiple bearers 5 are arranged in turn in the vertical direction, so that the space above the base 11 is effectively utilized, thereby facilitating miniaturization of the autonomous moving transfer robot, broadening the application range and improving the agility.

Based on the above description, a two-side load bearing two-arm type autonomous moving transfer robot provided according to the sixth aspect of the present disclosure is also obtained, and the two-side load bearing two-arm type autonomous moving transfer robot comprises a running mechanism provided according to the second aspect of the present disclosure, a mechanical arm 3 provided according to the third aspect of the present disclosure, a gripper 4 for the autonomous moving transfer robot provided according to the fourth aspect of the present disclosure, and a bearer 5 for the autonomous moving transfer robot provided according to the a fifth aspect of the present disclosure.

As the two-side load bearing two-arm type autonomous moving transfer robot only differs as described above from the one-side load bearing two-arm type autonomous moving transfer robot provided according to the first aspect of the present disclosure, the operation process also correspondingly differs in that, i.e. in the loading of foup boxes (target objects 400), when the bearers 5 on one side have been fully loaded with foup boxes, the bearers 5 on the other side are to be loaded, and the unloading is similar. Additionally, for the two-side load bearing two-arm type autonomous moving transfer robot, any direction in the longitudinal direction can be defined as the front.

One-Arm Autonomous Moving Transfer Robot

Figure 22:
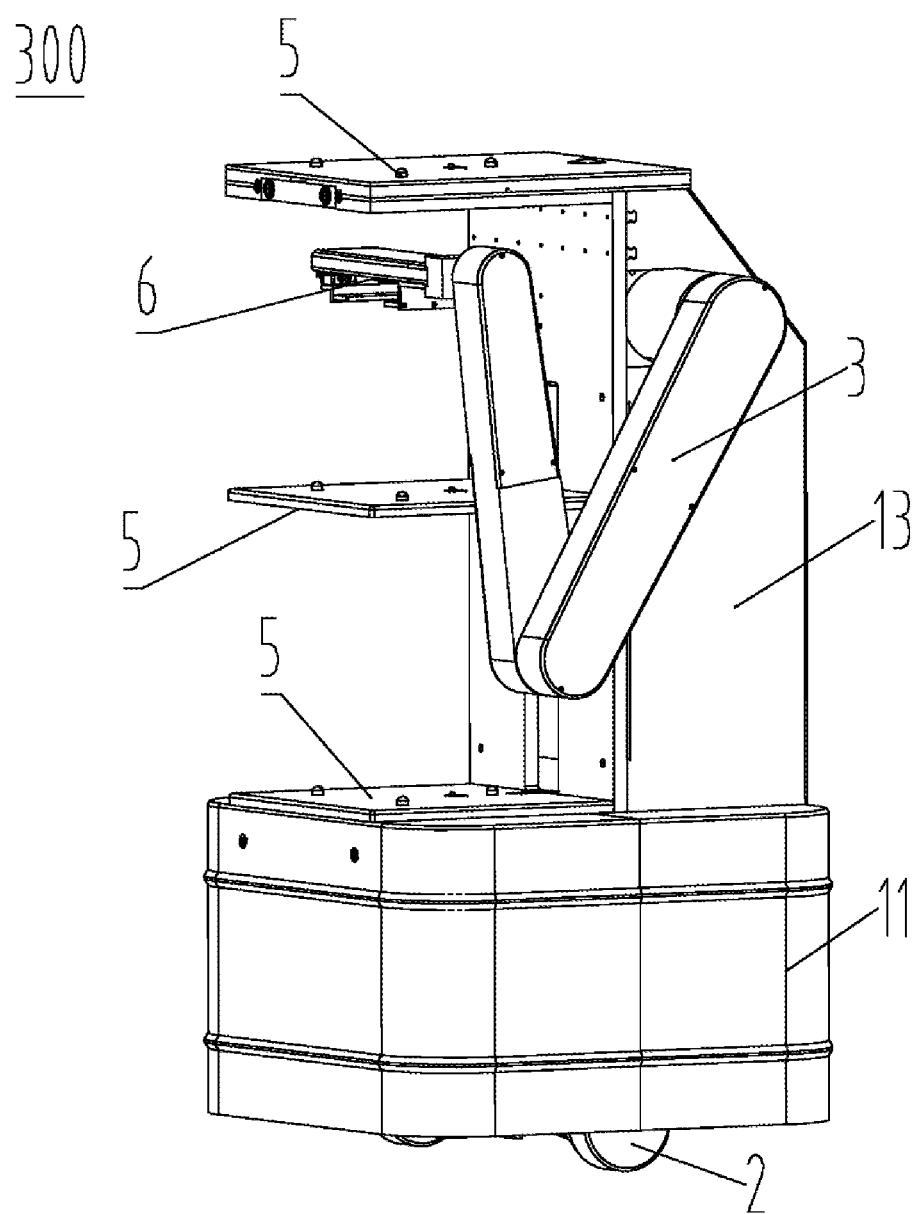
FIG. 22 shows a schematic perspective view of an autonomous moving transfer robot provided according to an embodiment of a seventh aspect of the present disclosure.

According to a seventh aspect of the present disclosure, there is provided a one-arm type autonomous moving transfer robot 300, which could differ from the autonomous moving transfer robot provided in the first aspect of the present disclosure in that: the autonomous moving transfer robot provided according to the seventh aspect of the present disclosure is provided with only one manipulator, as shown in FIG. 22, and the manipulator comprises a mechanical arm 3 (which could be the same as the mechanical arm 3 of the autonomous moving transfer robot provided in the first aspect of the present disclosure) and tongs 6 (instead of the gripper 4) pivotally connected to a distal end of the mechanical arm 3 for grasping/releasing a target object 400, the mechanical arm 3 being configured to be movable to move the tongs 6 to reach a desired position.

In addition to the difference described above, the autonomous moving transfer robot provided according to the seventh aspect of the present disclosure could further differ from the autonomous moving transfer robot provided according to the first aspect of the present disclosure just as the autonomous moving transfer robot provided according to the sixth aspect of the present disclosure differing from the autonomous moving transfer robot provided according to the first aspect of the present disclosure. That is, the autonomous moving transfer robot provided according to the seventh aspect of the present disclosure is provided with two vertical plates 12, a casing 13 is arranged between the two vertical plates 12 and forms a closed space with side surfaces, facing each other, of the two vertical plates 12, and a first driving device 331, a lead screw 341, a fixing seat 342, etc. of a mechanical arm 3 are disposed in the closed space. Two side surfaces, facing the outside, of the two vertical plates 12 both have the bearers 5 fixed thereto, and the bearers 5 on the same side surface are uniformly spaced apart in the vertical direction, as shown in FIG. 21. In consideration of spatial arrangement, an operation screen, i.e., a man-machine interaction interface is not provided.

By adopting the above technical scheme, the autonomous moving transfer robot provided according to the seventh aspect of the preset disclosure is capable of transferring multiple target objects 400 at a time. The specific working process is as follows: firstly, the control system controls the running mechanism 2 to run so as to move the unloaded autonomous moving transfer robot to a first position in which the target object 400 is stored; then, the control system controls the attitude of the tongs 6 (the angle of rotation of the tongs about a pivot axis thereof) and the movement of the mechanical arm 3 to send the tongs 6 to a desired position, so that the target object 400 is grasped; and thereafter, by controlling the movement of the mechanical arm 3, the grasped target object 400 is put onto one bearer 5 of the load bearing mechanism, thereby completing the "loading" of one target object 400. Then, the above process could be repeated until all of the bearers 5 have the target objects 400 put thereon. Then, the running mechanism 2 is controlled to run so as to move the autonomous moving transfer robot and foup boxes loaded thereof to a second position to which the target objects 400 are to be transferred, and the target objects 400 are in turn gripped by the manipulators from the corresponding bearers 5 and put on storage positions corresponding to the second position, thereby completing the "unloading" of the target objects 400. In the process, the position of the autonomous moving transfer robot could be changed by controlling the running mechanism 2 so as to facilitate the operation of the manipulators. According to the above description, the autonomous moving transfer robot provided in the present disclosure is capable of performing automatic transfer of the target objects 400 without manual loading and unloading, and is capable of carrying multiple target objects 400 in a single pass, thereby effectively improving the Takt time and working efficiency. Additionally, multiple bearers 5 are arranged in turn in the vertical direction, so that the space above the base 11 is effectively utilized, thereby facilitating miniaturization of the autonomous moving transfer robot, broadening the application range and improving the agility.

Figure 23:
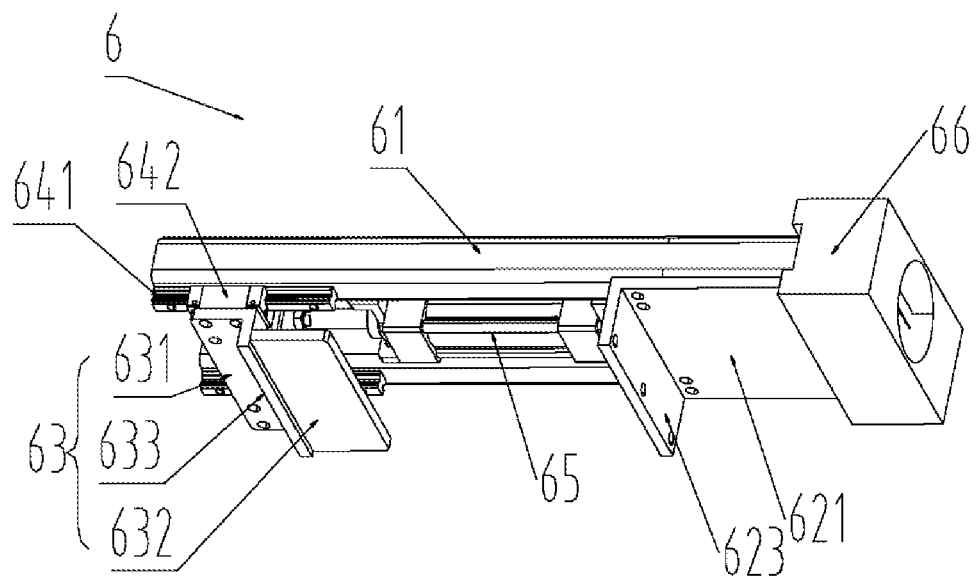
FIG. 23 shows a schematic perspective view of tongs of the autonomous moving transfer robot provided according to the embodiment of the seventh aspect of the present disclosure.
Figure 24:
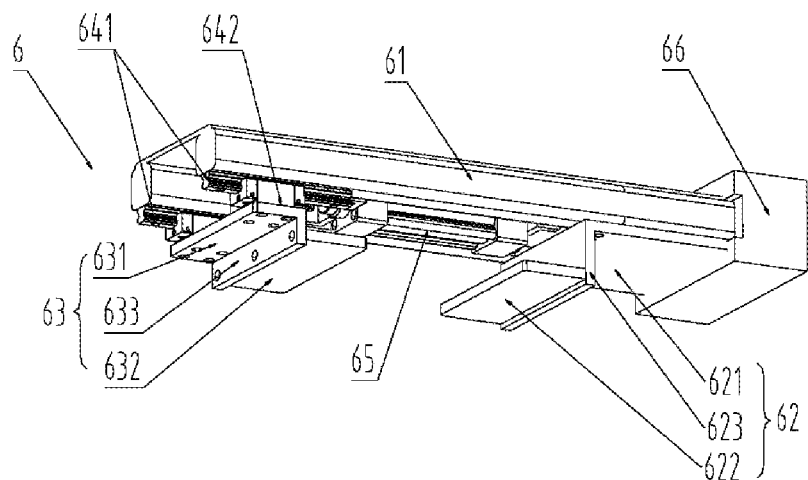
FIG. 24 shows a schematic perspective view, from another direction, of the tongs of the autonomous moving transfer robot provided according to the embodiment of the seventh aspect of the present disclosure.

Wherein, the tongs 6 could be configured in any suitable manner. Optionally, as shown in FIGS. 23 and 24, the tongs 6 comprises a tongs main body 61, a fixed clamping member 62 and a movable clamping member 63; the fixed clamping member 62 is fixed to the tongs main body 61, and the movable clamping member 63 is movably connected to the tongs main body 61 so as to be able to approach and move away from the fixed clamping member 62 and cooperate with the fixed clamping member 62 to grasp and release the target object 400.

Optionally, the movable clamping member 63 is connected to the tongs main body 61 via a slidable connection structure so as to approach and move away from the fixed clamping member 62. In embodiments of the present disclosure, the slidable connection structure could be configured in any suitable manner. Optionally, the slidable connection structure comprises a slide rail 641 and a slide groove 642 cooperating with each other, one of the slide rail 641 and the slide groove 642 being arranged on the tongs main body 61, while the other of the slide rail 641 and the slide groove 642 being arranged on the movable clamping member 63. For example, the slide rail 641 is arranged on the tongs main body 61. In order to prevent the slide groove 642 from disengaging from the slide rail 641, the slide groove 642 could be configured to be a dovetail groove.

In embodiments of the present disclosure, a driver 65 could be provided between the movable clamping member 63 and the tongs main body 61 for driving the movable clamping member 63 to move toward or away from the fixed clamping member 62. Wherein, the driver 65 could be configured in any suitable manner, and optionally, the driver 65 is configured to be a pneumatic cylinder, a cylinder body of the pneumatic cylinder is fixed to the tongs main body 61, and an end portion of a piston rod of the pneumatic cylinder is fixed to the movable clamping member 63. When the piston rod protrudes out of the cylinder body, the movable clamping member 63 is driven to move away from the fixed clamping member 62 to release the target object 400. When the piston rod retracts into the cylinder, the movable clamping member 63 is driven to approach the fixed clamping member 62 to grasp the target object 400.

In embodiments of the present disclosure, the fixed clamping member 62 could be configured in any suitable manner. Optionally, the fixed clamping member 62 comprises a fixed connection 621 connected to the tongs main body 61, a fixed clamp partion 622 and a first intermediate connection 623 connected between the fixed connection 621 and the fixed clamp partion 622; and the movable clamping member 63 comprises a movable connection 631 connected to the tongs main body 61, a movable clamp partion 632 and a second intermediate connection 633 connected between the movable connection 631 and the movable clamp partion 632, the first intermediate connection 623 and the second intermediate connection 633 provide a clamping space for the target object 400 between the fixed connection 621 and the movable connection 631 and the tongs main body 61, and the fixed clamp partion 622 and the movable clamp partion 632 extend towards each other to bear the target object 400.

Additionally, the tongs 6 further comprises a joint block 66 pivotally connected to the distal end of the mechanical arm 3, and the tongs main body 61 is fixed to the joint block 66. When the mechanical arm 3 is the manipulator provided according to the third aspect of the present disclosure, the joint block 66 is fixed to a hollow output shaft of a hollow shaft motor serving as a third driving device.

Additionally, in embodiments of the present disclosure, the tongs 6 could also be provided with a locating element, an alignment sensor, a proximity sensor, etc. as the gripper 4 provided in the fourth aspect of the present disclosure.

On the basis of the above description, a one-arm type autonomous moving transfer robot provided according to the seventh aspect of the present disclosure is also obtained, and the one-arm type autonomous moving transfer robot comprises a running mechanism provided according to the second aspect of the present disclosure, a mechanical arm 3 provided according to the third aspect of the present disclosure, and a bearer 5 for the autonomous moving transfer robot provided according to the a fifth aspect of the present disclosure.

As said one-arm type autonomous moving transfer robot differs as described above from the one-side load bearing two-arm type autonomous moving transfer robot provided according to the first aspect of the present disclosure, the operation process also correspondingly differs in that, i.e. throughout the loading and unloading of foup boxes (target objects 400), only one manipulator is used, and the tongs 6 is used to grasp and release the foup boxes. Additionally, during the loading of a two-side load bearing one-arm type autonomous moving transfer robot, when the bearers 5 on one side have been fully loaded with foup boxes, the bearers 5 on the other side are to be loaded, and the unloading is similar. Additionally, for the two-side load bearing one-arm type autonomous moving transfer robot, any direction in the longitudinal direction could be defined as the front.

While the foregoing is directed to the preferred embodiments of the present disclosure, it is not intended to limit the disclosure, but on the contrary, the intention is to cover all modifications, equivalents, and alternatives falling within the spirit and scope of the disclosure.

The invention claimed is:

1. An autonomous moving transfer robot, comprising:
   a main body comprising a base and a vertical plate fixed to the base and extending upwards in a vertical direction;
   a running mechanism comprising driving wheels and driven wheels mounted on the base;
   an operation mechanism comprising two manipulators each comprising a mechanical arm having a proximal end connected to the vertical plate and a gripper pivotally connected to a distal end of the mechanical arm, the mechanical arm being configured to allow the gripper to reach a desired position, the two manipulators driving the two grippers to move towards or away from each other to grip or release a target object;
   a load bearing mechanism comprising a plurality of board-like bearers for bearing the target object, the plurality of bearers being all fixed to a same side, either a front side or a rear side, of the vertical plate and spaced apart in the vertical direction; and
   a control system for controlling walking, stopping, and steering of the running mechanism and controlling movement of the two manipulators,
   wherein the mechanical arm comprises a telescopic arm, a rotary arm and a driving device which is electrically connected with the control system, the rotary arm comprises a plurality of arm sections hinged in sequence, and has a proximal end hinged to a distal end of the telescopic arm and a distal end pivotally connected to the gripper, the driving device comprises: a first driving device for driving the telescopic arm to move in a transverse direction and a second driving device for driving the arm sections to rotate about respective hinge shafts thereof, wherein the respective hinge shafts of the arm sections are parallel to each other and parallel to the transverse direction;
   the gripper comprises a gripper main body and a resilient clamping member, the gripper main body is provided with a support table for the target object and a boss above the support table, the resilient clamping member has a proximal end fixedly connected to the boss and a distal end, opposite to the proximal end, for pressing against the target object so as to cooperate with the supporting table to releasably grip the target object.

2. The autonomous moving transfer robot according to claim 1, wherein,
   the running mechanism comprises two driving wheels and at least two driven wheels, the driving wheel has a central rotation axis and is hinged to the base, and a resilient member is arranged between the base and the driving wheel, and has a first end pressing against the base and a second end, opposite to the first end, pressing against the driving wheel such that the driving wheel is rotatable about a pivot axis parallel to the central rotation axis to move up and down relative to the base;
   the driving wheel comprises a mounting bracket, a driving motor fixed to the mounting bracket, and a driving wheel roller fixed to an output shaft of the driving motor, the driving motor is electrically connected with the control system and is used for driving the driving wheel roller to rotate about an axis of the output shaft of the driving motor, the mounting bracket is connected, via a pivot shaft, to a hinge receiver fixed to the base, the second end of the resilient member presses against the mounting bracket; the resilient member is configured to be a spring plunger fixed to the base and having a head pressing against the mounting bracket to serve as the second end; each driving wheel is correspondingly provided with two spring plungers;
   the pivot shaft is configured to be a pin having one end terminally stopped by the mounting bracket and the other end stopped by the hinge receiver via a stopper, and the stopper is configured to be a hoop;
   the central rotation axes of the two driving wheels are collinear, and a driven wheel group comprises two pairs of driven wheels, wherein in the direction of the central rotation axis, one pair of driven wheels is disposed on one side of the driving wheels and the other pair of driven wheels is disposed on the other side of the driving wheels;
   the two pairs of driven wheels are symmetrically arranged about the central rotation axis; and
   the driven wheels are configured to be mecanum wheels.

3. The autonomous moving transfer robot according to claim 1, wherein, the resilient clamping member comprises a first resilient clamping member having a first proximal end fixed to the boss and a first distal end, opposite to the first proximal end, extending over the support table to form an resilient clamp, a clamping space for the target object is defined between the resilient clamp and the support table, and the resilient clamp provides the target object with a resilient clamping force towards the support table; a terminal of the first distal end is bent in a direction away from the support table for guiding the target object into the clamping space;

the support table is provided with a first cushion made of elastic material, and at least two first cushions are provided and are spaced apart in the clamping space.

4. The autonomous moving transfer robot according to claim 1, wherein, the bearer comprises:
- a board-like main body having a bearing surface for bearing the target object,
- a positioning structure fixed on the bearing surface to mate with a positioning slot of the target object to limit movement of the target object on the board-like main body,
- an RFID antenna electrically connected with the control system and fixed to the board-like main body for reading a serial number of the target object, and
- a target object detection device electrically connected with the control system and fixed to the board-like main body for detecting whether a target object is placed on the bearer or not.

5. The autonomous moving transfer robot according to claim 1, wherein, the base is provided with two distance detection devices which are arranged on at least one of a front or a rear side of the autonomous moving transfer robot and spaced apart in a transverse direction of the autonomous moving transfer robot for detecting a distance between the autonomous moving transfer robot and a shelf, the control system is electrically connected with the two distance detection devices to control the running mechanism according to a distance signal from the distance detection device so as to align the autonomous moving transfer robot with a shelf for storing the target object.

6. The autonomous moving transfer robot according to claim 1, wherein, a first obstacle avoidance sensor for detecting surrounding obstacles is provided on both front and rear sides of the base and is electrically connected with the control system, and the control system controls the running mechanism to stop moving and gives an alarm after receiving a danger signal sent by the first obstacle avoidance sensor;

a second obstacle avoidance sensor is provided on at least one of a left or a right side of the first obstacle avoidance sensor to assist the first obstacle avoidance sensor; the first obstacle avoidance sensor comprises at least two infrared sensors disposed, respectively, on the front and rear sides of the autonomous moving transfer robot;

the base is provided with anti-collision strips extending around outside the base, a collision sensor is arranged in the anti-collision strip and is electrically connected with the control system, and the control system controls the running mechanism to stop moving and gives an alarm after receiving a danger signal sent by the collision sensor.

7. The autonomous moving transfer robot according to claim 1, wherein, the main body comprises a casing enclosing a closed space with the vertical plate, an operation screen is arranged on the casing and tilts to facilitate man-machine interaction operation, and the operation screen is included in the control system.

8. The autonomous moving transfer robot according to claim 1, wherein, a bottom camera is arranged on a lower surface of the base and electrically connected with the control system, and ground distance detection devices are arranged at four corners of the base and are electrically connected with the control system.

9. The autonomous moving transfer robot according to claim 1, wherein, the first driving device is configured to be a motor, and the telescopic arm is connected with an output shaft of the motor through a transmission so as to allow rotational motion of the output shaft to be converted into linear motion of the telescopic arm in the transverse direction;

the motor is a hollow shaft motor, and the transmission is configured to be a lead screw transmission comprising a lead screw and a nut cooperating with each other, the lead screw is fixed by a fixing seat, the nut is fixed to a hollow output shaft of the hollow shaft motor, the hollow shaft motor is fixedly connected to the telescopic arm;

the hollow shaft motor is fixed to a first fixing plate, the telescopic arm is fixed to a second fixing plate, and the first fixing plate and the second fixing plate are both fixed to a sliding block which cooperates with guide rods extending in the transverse direction and arranged on equipment where the mechanical arm is provided.

10. The autonomous moving transfer robot according to claim 1, wherein, the second driving device is a hollow shaft motor, the rotary arm comprises a first arm section and a second arm section, and the first arm section has a proximal end hinged to the telescopic arm via a hollow shaft motor, and a distal end hinged to a proximal end of the second arm section via a second driving device;

the arm sections extend in a direction perpendicular to the transverse direction, and are hollow; and the telescopic arm extends in the transverse direction and are hollow.

11. The autonomous moving transfer robot according to claim 1, wherein, the driving device further comprises a third driving device for driving the gripper to rotate about a pivot shaft thereof which is arranged parallel to the transverse direction;

the third driving device is a hollow shaft motor provided at the distal end of the rotary arm, and a hollow shaft of the hollow shaft motor is configured to be connected to the gripper.

12. The autonomous moving transfer robot according to claim 1, wherein, the resilient clamping member comprises a second resilient clamping member, the gripper main body is provided with a trench groove between the support table and the boss, the second resilient clamping member is arranged in the trench groove, and has a second proximal end fixed to a side wall of the boss and a second distal end, opposite to the second proximal end, for pressing against the target object so as to provide the target object with an outward resilient clamping force;

an end portion of the second distal end is bent inward with the bend facing outward;

a side wall of the boss is connected with a second cushion made of elastic material, and at least two second cushions are provided and are spaced apart on the side wall of the boss.

13. The autonomous moving transfer robot according to claim 1, wherein, the gripper comprises a locating element for aligning with a mark on the target object, the locating element is retractably connected to the boss, an alignment sensor is provided on an end portion of the locating element and is electrically connected with the control system, and when the end portion of the locating element is aligned with the mark, the alignment sensor sends a validating signal, otherwise sends an alarm signal; a proximity sensor is provided on the boss and is electrically connected with the control system, and when the locating element is retracted and approaches the proximity sensor, the proximity sensor sends a position confirmation signal.

14. The autonomous moving transfer robot according to claim 1, wherein, the gripper further comprises a closure plate fixedly connected to the boss above the boss, the gripper is provided with a first signal light source for indicating that the target object is in the gripping position, the first signal light source is electrically connected with the control system and is arranged within the closure plate, and the closure plate is made of translucent or transparent material;

the gripper further comprises a connecting block to be pivotally connected with the mechanical arm of the autonomous moving transfer robot, and the gripper main body is fixedly connected to the connecting block.

15. The autonomous moving transfer robot according to claim 1, wherein, a photographing camera is arranged on a front side of one of the two grippers of the two manipulators and is electrically connected with the control system, and a flash lamp is arranged on a front side of the other of the two grippers of the two manipulators and is electrically connected to the control system.

16. The autonomous moving transfer robot according to claim 4, wherein, the positioning structure is configured to be three positioning columns arranged to form a triangular shape, the target object detection device comprises a detection portion protruding from the bearing surface, and when the positioning slot of the target object mates with the positioning structure, the detection portion is capable of retracting into the board-like main body under the action of gravity of the target object, and the target object detection device sends an acknowledgement signal to indicate that there is a target object is placed onto the bearing surface.

17. The autonomous moving transfer robot according to claim 4, wherein, the RFID antenna is disposed adjacent to the target object detection device to facilitate wiring;

the target object detection device is configured to be a photosensor.

18. The autonomous moving transfer robot according to claim 4, wherein, the board-like main body comprises a main board, a sandwiched board and a cover board which are sequentially connected in an overlapping manner, and the sandwiched board has an opening formed therein, a second signal light source is arranged in the opening and electrically connected with the control system, and the second signal light source is capable of emitting light of multiple colors each indicating one working condition; the cover board and the sandwiched board are both made of translucent or transparent material to transmit light; an emergency stop button is arranged on the cover board and electrically connected with the control system; the second signal light source is configured to be bar-shaped, and four second signal light sources are arranged in the opening and emit light towards the front, rear, left and right, respectively; and the cover board and the sandwiched board are both made of organic glass material.

19. The autonomous moving transfer robot according to claim 4, wherein, the bearer is provided with a binocular camera electrically connected with the control system, and the binocular camera is fixed to the board-like main body;

the bearer is provided with a third obstacle avoidance sensor electrically connected with the control system, and the third obstacle avoidance sensor is fixed to the board-like main body, at least two third obstacle avoidance sensors are provided, and the binocular camera is located between two of obstacle avoidance sensors.

* * * * *